(12) United States Patent
Yamazaki et al.

(10) Patent No.: US 6,617,648 B1
(45) Date of Patent: Sep. 9, 2003

(54) PROJECTION TV

(75) Inventors: Shunpei Yamazaki, Tokyo (JP); Hisashi Ohtani, Kanagawa (JP); Masahiko Hayakawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/255,778

(22) Filed: Feb. 23, 1999

(30) Foreign Application Priority Data

Feb. 25, 1998 (JP) .......................................... 10-060440

(51) Int. Cl.⁷ .................. H01L 27/01; H01L 27/12; H01L 31/0392
(52) U.S. Cl. ...................... 257/350; 257/59; 257/72; 257/296
(58) Field of Search .................... 257/59, 72, 350, 257/296

(56) References Cited

U.S. PATENT DOCUMENTS

| | | | |
|---|---|---|---|
| 5,888,858 A | 3/1999 | Yamazaki et al. | |
| 5,985,740 A | 11/1999 | Yamazaki et al. | |
| 6,063,654 A | 5/2000 | Ohtani | |
| 6,077,731 A | 6/2000 | Yamazaki et al. | |
| 6,093,934 A | 7/2000 | Yamazaki et al. | |
| 6,100,562 A | 8/2000 | Yamazaki et al. | |
| 6,140,667 A | 10/2000 | Yamazaki et al. | |
| 6,160,271 A * | 12/2000 | Yamazaki et al. | ............. 257/59 |
| 6,268,842 B1 | 7/2001 | Yamazaki et al. | |
| 6,271,818 B1 * | 8/2001 | Yamazaki et al. | ............. 345/92 |
| 6,278,131 B1 | 8/2001 | Yamazaki et al. | |
| 6,294,815 B1 | 9/2001 | Yamazaki et al. | |
| 6,303,963 B1 | 10/2001 | Ohtani et al. | |
| 6,307,214 B1 | 10/2001 | Ohtani et al. | |
| 6,325,515 B1 | 11/2001 | Yamazaki et al. | |
| 6,326,249 B1 | 12/2001 | Yamazaki et al. | |
| 6,335,716 B1 | 1/2002 | Yamazaki et al. | |
| 6,376,862 B1 | 4/2002 | Yamazaki et al. | |
| 6,407,430 B1 | 6/2002 | Ohtani et al. | |
| 6,441,758 B1 | 8/2002 | Koyama et al. | |
| 6,452,211 B1 | 9/2002 | Ohtani et al. | |
| 6,452,341 B1 | 9/2002 | Yamaguchi et al. | |
| 6,472,684 B1 | 10/2002 | Yamazaki et al. | |

OTHER PUBLICATIONS

Ohtani et al., "LP–B: Late–News Poster: A 60–in. HDTV Rear–Projector with Continuous–Grain Silicon Technology", May 17–22, 1998, pp. 467–470, SID 98 Digest, International Symposium Digest of Technical Papers, vol. XXIX.

* cited by examiner

*Primary Examiner*—Ngân V. Ngô
(74) *Attorney, Agent, or Firm*—Eric J. Robinson; Robinson Intellectual Property Law Office, P.C.

(57) ABSTRACT

Thin-film transistors constituting a liquid crystal module have a channel forming region that is a crystal structural body in which a plurality of rod-like or flat-rod-like crystals are arranged in a particular direction. In the thin-film transistors, deteriorations in device characteristics due to hot carrier injection or the like can be prevented effectively when the temperature is in a range of 80° C.–250° C. (preferably 100° C.–200° C.). Therefore, a projection TV that is very high in reliability can be realized.

27 Claims, 16 Drawing Sheets

PROJECTION TV

BACKGROUND OF THE INVENTION

1. Field of the Invention

The present invention relates to a projection TV receiver (hereinafter referred to as a projection TV) having semiconductor circuits that are constituted of thin-film transistors using a thin-film semiconductor.

2. Description of the Related Art

In recent years, the technology of constructing semiconductor circuits by forming TFTs on a substrate having an insulating surface has made a rapid progress. A typical example of such semiconductor circuits is an electro-optical device such as an active matrix liquid crystal display device.

The active matrix liquid crystal display device is a monolithic display device in which a pixel matrix circuit and driver circuits are formed on the same substrate. Further, the system-on-panel which incorporates not only a pixel matrix circuit and driver circuits but also a memory circuit and logic circuits such as a clock generation circuit is now being developed.

With increased demand for electronic devices that utilize such display devices, keen competition for development of such electronic devices is now being made. A typical example of those electronic devices is a projector.

The projector is a device for applying strong light emitted from a backlight to a liquid crystal display device and projecting an image formed by the pixel matrix circuit of the liquid crystal display device onto a large-size screen.

The projector is generally classified into two types. The type in which an image is projected onto a rectangular screen whose sides measure several meters from the front side is called a front projector (or a front projection TV). The type in which an image is projected onto a screen having a diagonal size of tens of inches from the back side is called a rear projector (or a rear projection TV).

Particularly in recent years, with the scheduled full digitization of ground-wave broadcasts, the rear projection TV has becomes the most promising candidate for future TVs for home use. This is based on a view that the rear projection TV will be advantageous over the CRT-type TV in terms of resolution, compactness, weight (lighter weight is preferable), set productivity, and power consumption (lower power consumption is preferable).

SUMMARY OF THE INVENTION

In view of the above-mentioned demand, an object of the present invention is to provide a projection TV that is highly reliable and easy to maintain.

According to a first aspect of the invention, there is provided a projection TV having at least an optical system and a liquid crystal module, wherein thin-film transistors constituting the liquid crystal module have a channel forming region that is a crystal structural body in which a plurality of rod-like or flat-rod-like crystals are arranged approximately parallel with each other in a particular direction; and wherein the thin-film transistors have an operation temperature of 80° C.–250° C.

According to a second aspect of the invention, there is provided a projection TV having at least an optical system and a liquid crystal module, wherein thin-film transistors constituting the liquid crystal module have a channel forming region that is a crystal structural body in which a plurality of rod-like or flat-rod-like crystals are arranged approximately parallel with each other in a particular direction and crystal lattices are continuous at most of grain boundaries; and wherein the thin-film transistors have an operation temperature of 80° C.–250° C.

The most important features of the invention are that the kink effect (the phenomenon that the operation is rendered out of control owing to hot carrier injection or the like) in a thin-film transistor is prevented or inhibited in a state that it is operating, and that a liquid crystal module that is constructed by using such thin-film transistors is applied to a projection TV.

The thin-film transistor utilized in the invention has a feature that the kink effect is prevented in a state that the thin-film transistor is operating in such a manner that charge that is captured in a gate insulating film by hot carrier injection or the like during operation is released by self-heating that is caused by the operation.

Because of the unique feature that the resistance to deterioration is increased by heating, this type of thin-film transistor is considered a switching element that is most suitable for use in a projection TV which is prone to accumulate inside heat that is generated by strong light coming from a backlight or by self-heating.

DETAILED DESCRIPTION OF THE PREFERRED EMBODIMENTS

Figure 1A:
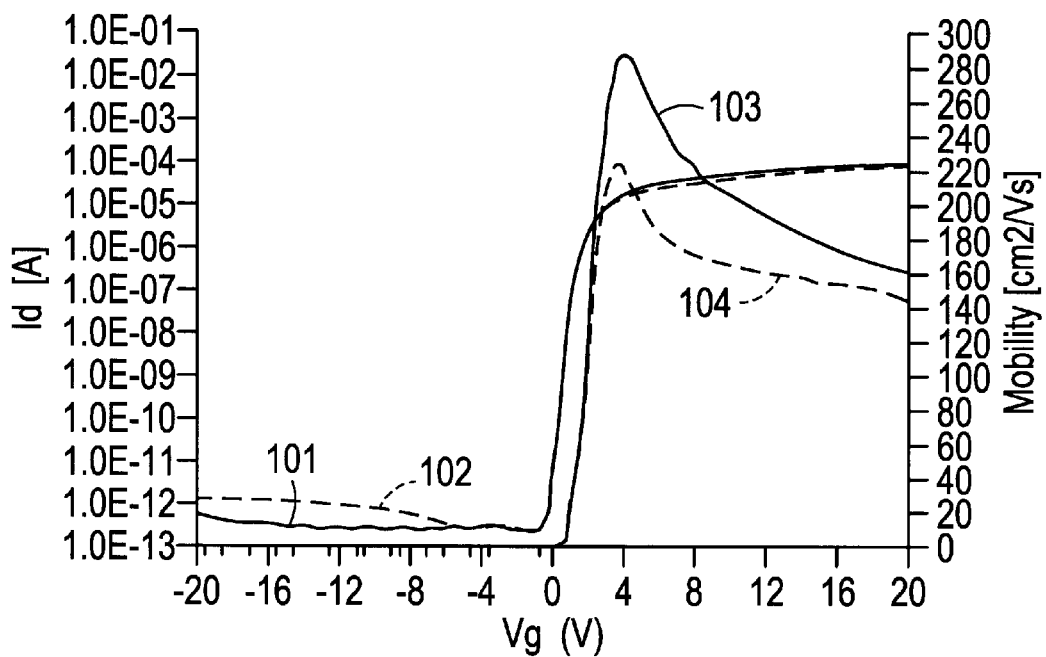
FIGS. 1A and 1B show electrical characteristics of TFTs according to a first embodiment of the present invention.

The present invention will be hereinafter described in detail by using embodiments.

Embodiment 1

In this embodiment, a case where a pixel matrix circuit and peripheral circuits are constructed monolithically by forming TFTs according to the invention on a substrate having an insulating surface will be described mainly with reference to FIGS. 3A–3D, 4A–4D, and 5A–5C. In this embodiment, a CMOS circuit which is a basic circuit is used as an example of peripheral circuits such as driver circuits and logic circuits.

First, a quartz substrate 301 is prepared as a substrate having an insulating surface. A ceramic substrate formed with an insulating film of 0.5–5$\mu$m in thickness, a silicon substrate, or the like can be used instead of a quartz substrate. Since low-grade silicon substrates as used in solar cells are inexpensive, they are effective for uses in which a transparent substrate is not needed, such as a reflection-type display device.

Reference numeral 302 denotes an amorphous silicon film. An adjustment is so made that the final thickness (after reduction by thermal oxidation) of the amorphous silicon 302 becomes 10–75nm (preferably 15–45nm). TFTs to be formed in this embodiment have a very thin active layer, and hence are FD (full depletion) TFTs in which the channel forming region is completely depleted in an on-state (i.e., a state that a channel is formed).

The amorphous silicon film 302 may be formed by low pressure CVD or plasma CVD. A silicon film containing germanium as represented by $Si_{1-x}Ge_x$, may be used instead of an amorphous silicon film.

Then, the amorphous silicon film 302 is crystallized in the following manner. The technique disclosed in Japanese Unexamined Patent Publication No. Hei. 7-130652 of the present inventors is used as a crystallization method. Although the method of either the first embodiment or the second embodiment of this publication can be used, it is preferable to utilize the technique described in the second embodiment (described in more detail in Japanese Unexamined Patent Publication No. Hei. 8-78329).

In the technique disclosed in the publication No. Hei. 8-78329, first, a mask insulating film 303 for selecting adding regions for a material for promoting crystallization of silicon is formed. To allow addition of a material for promoting crystallization of silicon, the mask insulating film 303 has openings at a plurality of positions. The positions of crystal regions can be determined by the positions of the openings.

Figure 3A:
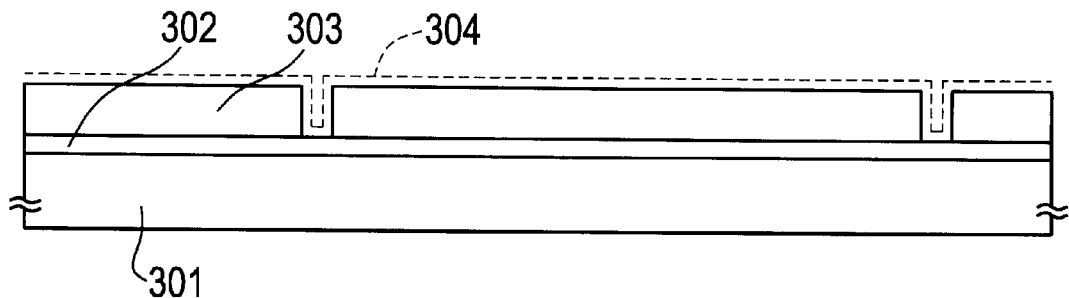
FIGS. 3A–3D, 4A–4D, and 5A–5C show a manufacturing process of thin-film transistors according to a first embodiment.

A nickel (Ni) containing layer 304 is then formed by applying, by spin coating, a solution containing nickel as a material for accelerating crystallization of the amorphous silicon film 302 (see FIG. 3A). Examples of the material other than nickel are germanium (Ge), cobalt (Co), iron (Fe), palladium (Pd), platinum (Pt), copper (Cu), and gold (Au).

The material may be added by ion implantation or plasma doping using a resist mask. These techniques are effective in constructing a miniaturized circuit because they facilitate reduction of the areas occupied by addition regions for the material for promoting crystallization of silicon and control of the growth lengths of lateral growth regions.

After completion of the material adding step, hydrogen removal is performed at 450° C. for about 1 hour. Then, the amorphous silicon film 302 is crystallized by performing a heat treatment at 500–700° C. (typically 550° C.–650° C.) for 4–24 hours in an inert atmosphere, a hydrogen atmosphere, or an oxygen atmosphere. In this embodiment, a heat treatment is performed at 570° C. for 14 hours in a nitrogen atmosphere.

Figure 3B:
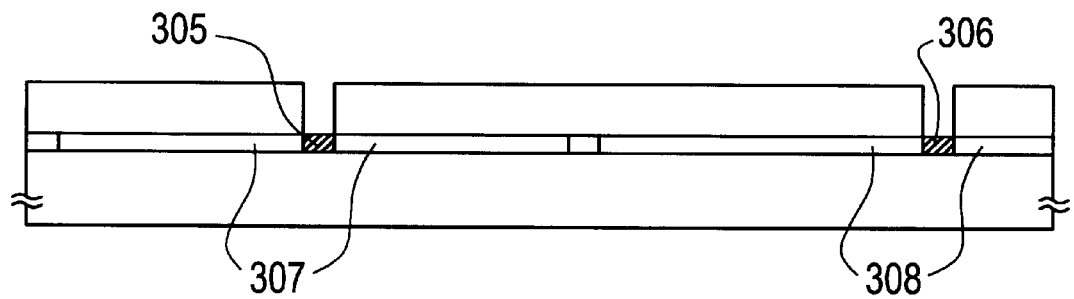

In this step, crystallization of the amorphous silicon film 302 proceeds with priority from nickel addition regions 305 and 306, whereby crystal regions 307 and 308 are formed that have grown approximately parallel with the surface of the substrate 301 (see FIG. 3B). The inventors call the crystal regions 307 and 308 lateral growth regions.

After completion of the heat treatment for crystallization, the mask insulating film 303 is removed and patterning is performed to form island-like semiconductor layers (active layers) 309–311 each of which is part of the lateral growth region 307 or 308 in its entirety. Reference numeral 309 denotes the active layer of an n-type TFT to constitute a CMOS circuit, 310 denotes the active layer of a p-type TFT to constitute the CMOS circuit, and 311 denotes the active layer of an n-type TFT (pixel TFT) to constitute a pixel matrix circuit (see FIG. 3C).

Figure 3C:
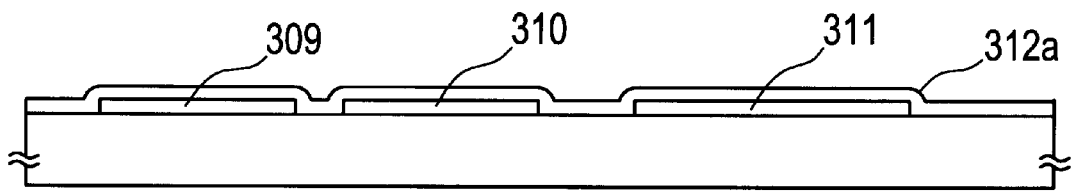

After the formation of the active layers 309–311, a gate insulating film 312$a$ that is an insulating film containing silicon is formed thereon (see FIG. 3C). The thickness (after increase in a later thermal oxidation step) of the gate insulating film 312$a$ may be adjusted in a range of 20–250 nm. The film forming method may be a known vapor-phase method (plasma CVD, sputtering, or the like).

Figure 3D:
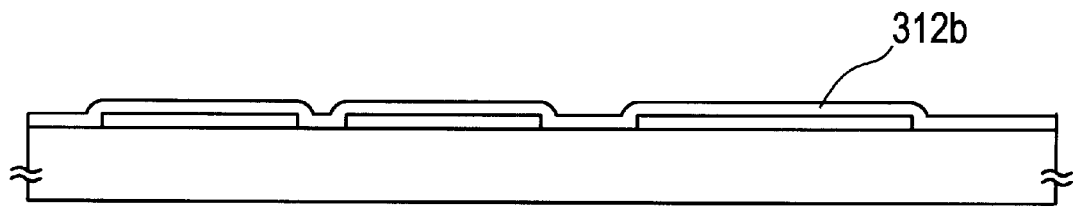

Then, as shown in FIG. 3D, a heat treatment (a process for gettering the material for promoting crystallization of silicon) is performed to remove or reduce the concentration of the material (nickel). In this heat treatment, a halogen element is contained in a processing atmosphere and the metal element gettering effect of the halogen element is utilized.

To allow the halogen element to fully exhibit its gettering effect, it is preferable to perform the above heat treatment at a temperature higher than 700° C. At a temperature of 700° C. or less, there is a possibility that a halogen compound in the processing atmosphere is hard to decompose and the gettering effect is not obtained.

Therefore, in this embodiment, the heat treatment is performed at a temperature higher than 700° C., preferably 800° C.–1,000° C. (typically 950° C.), for 0.1–6 hours (typically 0.5–1 hour).

In this embodiment, for example, a heat treatment is performed at 950° C. for 30 minutes in an oxygen atmosphere containing hydrogen chloride (HCl) at 0.5–10 vol % (typically 3 vol %). An HCl density higher than the above range is not preferable because asperity on approximately the same level as the thickness of the active layers 309–311 is formed on their surfaces.

The compound (gas) containing a halogen element other than HCl can be one or a plurality of compounds selected from HF, $NF_3$, $HB_r$, $Cl_2$, $ClF_3$, $BCl_3$, $F_2$, $Br_2$ and the like.

It is considered that in this step nickel in the active layers 309–311 is removed in such a manner that it is gettered by the action of chlorine and escapes into the air in the form of volatile nickel chloride. After execution of this step, the nickel concentration in the active layers 309–311 is reduced to $5\times10^{17}$ atoms/$cm^3$ or less.

The value $5\times10^{17}$ atoms/$cm^3$ is a lower detection limit of SIMS (secondary ion mass spectroscopy). At present, we can only say that the nickel concentration is reduced down to the SIMS lower detection limit. However, it seems that actually the nickel concentration is reduced to $1\times10^{14}$ to $1\times10^{17}$ atoms/$cm^3$.

When TFTs were manufactured experimentally and analyzed by the inventors, no influence of nickel on the TFT characteristics was found if the nickel concentration was $1 \times 10^{18}$ atoms/cm$^3$ or less (preferably $5 \times 10^{17}$ atoms/cm$^3$ or less). In this specification, an impurity concentration is defined by a minimum value of measurement results of a SIMS analysis.

During the above heat treatment, a thermal oxidation reaction proceeds at the interfaces between the active layers 309–311 and the gate insulating film 312a and, as a result, the thickness of the gate insulating film 312b increases by the thickness of a resulting thermal oxidation film. Forming a thermal oxidation film in this manner provides semiconductor/insulating film interfaces in which the concentration of interface states is very low, as well as an effect of preventing erroneous formation (edge thinning) of a thermal oxidation film at the edges of the active layers 309–311.

It is effective to improve the film quality of the gate insulating film 312b by performing a heat treatment at 950° C. for about 1 hour in a nitrogen atmosphere after the heat treatment in a halogen-containing atmosphere.

It was also confirmed by a SIMS analysis that the halogen element that had been used in the gettering step remained in the active layers 309–311 at a concentration of $1 \times 10^{15}$ to $1 \times 10^{20}$ atoms/cm$^3$, and that the halogen element exist at a high concentration between the active layers 309–311 and the thermal oxidation film formed by the heat treatment.

Thereafter, a metal film (not shown) having aluminum as the main component is formed and then patterned into starting members 313–315 of gate electrodes that will be formed later (see FIG. 4A). In this embodiment, an aluminum film containing scandium at 2 wt % is formed. Other examples of the metal film are a tantalum film and a conductive silicon film.

In this state, the technique disclosed in Japanese Unexamined Patent Publication No. Hei. 7-135318 is utilized in the following manner. This publication discloses a technique of forming source and drain regions and low-concentration impurity regions in a self-aligned manner by using oxide films formed by anodization.

First, porous anodic oxide films 316–318 are formed by performing anodization in a 3%-aqueous solution of oxalic acid in a state that a resist mask (not shown) that was used in patterning the aluminum film is left.

The thickness of the porous anodic oxide films 316–318 increases in proportion to the processing time. Since the resist mask remains on top of the gate electrode starting members 313–315, the porous anodic oxide films 316–318 are formed only on the side faces of the starting members 313–315. According to the technique of the publication No. Hei. 7-135318, the thickness of the porous anodic oxide films 316–318 is equal to the length of low-concentration impurity regions (also called LDD regions) that will be formed later. In this embodiment, the anodization is performed under such conditions that the thickness becomes 700 nm.

Thereafter, the resist mask (not shown) is removed and then anodization is performed in an electrolyte obtained by mixing tartaric acid in an ethylene glycol solution at 3%. In this step, dense, non-porous anodic oxide films 319–321 are formed. Since the electrolyte permeates the porous anodic oxide films 316–318, the non-porous anodic oxide films 319–321 are also formed inside the porous anodic oxide films 316–318, respectively.

The thickness of the non-porous anodic oxide films 319–321 is determined by the application voltage. In this embodiment, the anodization is performed with the application voltage set at 80 V so as to provide a thickness of about 100 nm.

Figure 4A:
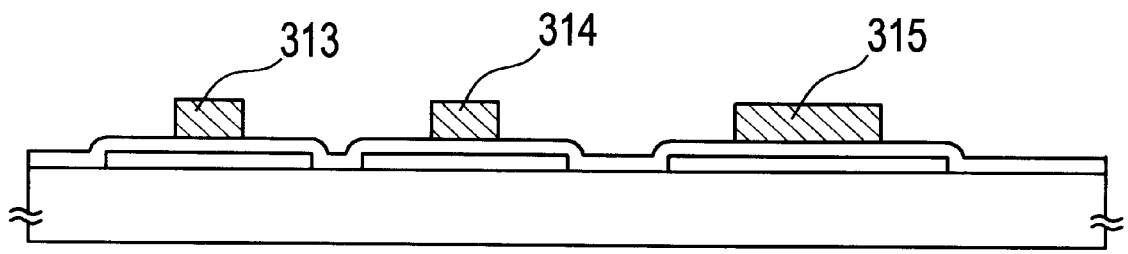
Figure 4B:
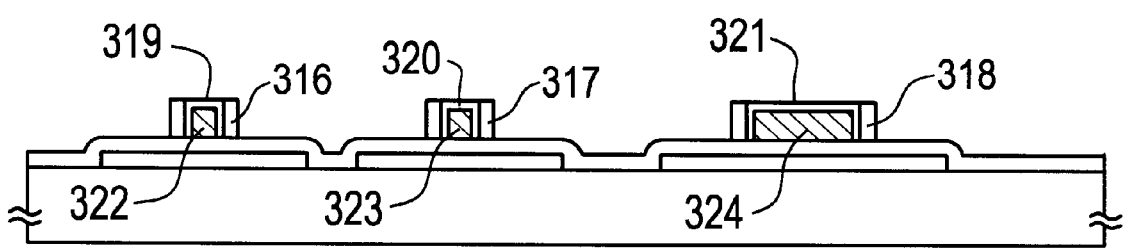
Figure 4C:
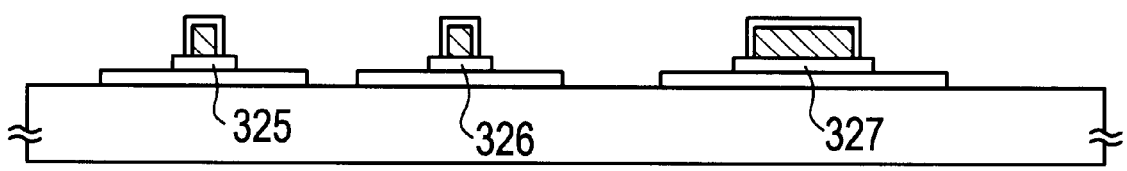

Aluminum films 322–324 that remain after the above two anodization steps will substantially function as gate electrodes (see FIG. 4B).

After the state of FIG. 4B has been obtained, the gate insulating film 312b is etched by dry etching with the gate electrodes 322–324and the porous anodic oxide films 316–318 used as masks. Then, the porous anodic oxide films 316–318 are removed. The end portions of gate insulating films 325–327 thus formed are exposed by the thickness of the porous anodic oxide films 316–318 (see FIG. 4C).

Then, impurity ions for imparting n-type conductivity (although phosphorus is used in this embodiment, arsenic may be used instead) are added in two steps as described below.

In this embodiment, the first impurity addition is performed at a high acceleration voltage and n-regions are formed. Because of the high acceleration voltage (about 80 kV), impurity ions are added to not only the exposed surface portions of the active layers 309–311 but also their portions under the exposed end portions of the gate insulating films 325–327. An adjustment is so made that the P ion concentration of the n$^-$ regions becomes $1 \times 10^{18}$ to $1 \times 10^{19}$ atoms/cm$^3$.

Then, the second impurity addition is performed at a low acceleration voltage and n$^+$ regions are formed. Because of the low acceleration voltage (about 10 kV), the gate insulating films 325–327 function as masks. An adjustment is so made that the sheet resistance of the n$^+$ regions become 500 Ω or less (preferably 300 Ω or less).

As a result of the execution of the above steps, a source region 328, a drain region 329, low-concentration impurity regions 330, and a channel forming region 331 of an n-type TFT to constitute a CMOS circuit are formed. Further, a source region 332, a drain region 333, low-concentration impurity regions 334, and a channel forming region of an n-type TFT (pixel TFT) are defined (see FIG. 4D).

Figure 4D:
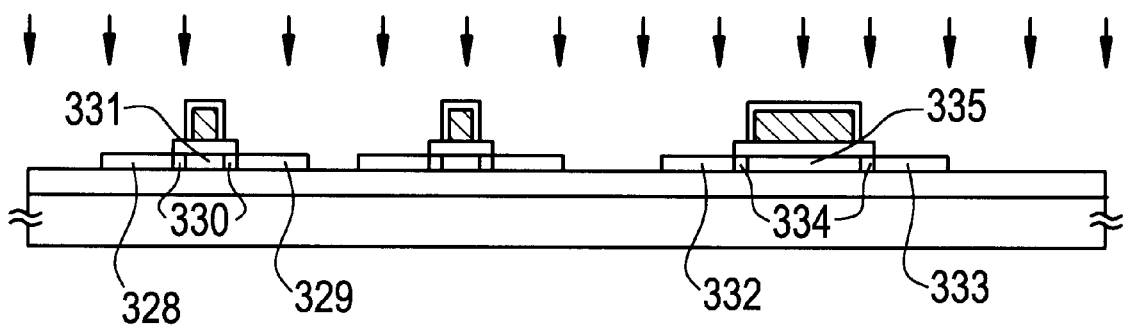

In the state of FIG. 4D, the active layer of a p-type TFT to constitute the CMOS circuit has the same structure as the active layer of the n-type TFT to constitute the CMOS circuit.

Thereafter, a resist mask 336 is formed so as to cover the n-type TFTs and then impurity ions for imparting p-type conductivity (boron is used in this embodiment) are added.

This impurity addition step is performed in two steps as in the case of the above step. Since inversion from the n type to the p type is needed, B ions are added at a concentration several times higher than the concentration of P ions in the above step.

Figure 5A:
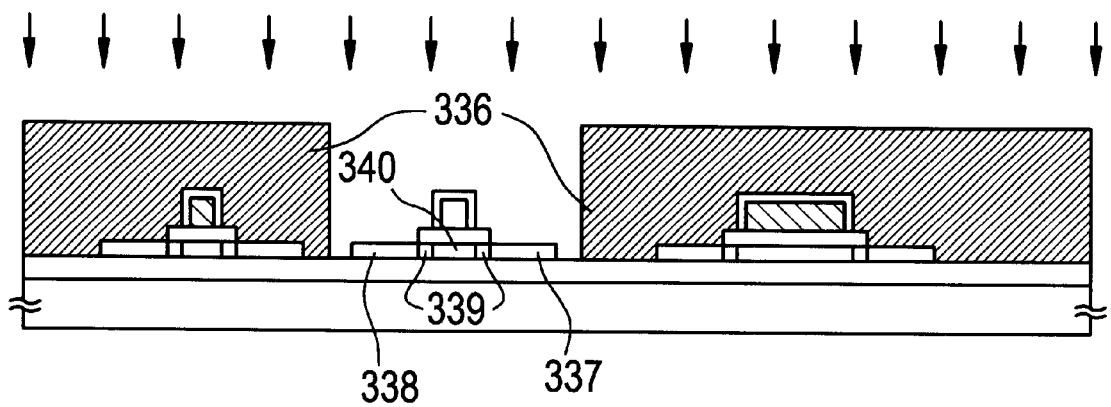

As a result, a source region 337, a drain region 338, low-concentr ation impurity regions 339, and a channel forming region 340 of the p-type TFT to constitute the CMOS circuit are formed (see FIG. 5A).

After completion of the active layers, impurity ions are activated by a combination of furnace annealing, laser annealing, lamp annealing, etc. At the same time, damage of the active layers that has been caused by the impurity adding steps is repaired.

Then, a silicon oxide film, a silicon nitride film, a silicon oxynitride film, an organic resin film, or a laminated film thereof is formed as an interlayer insulating film 341. In this embodiment, a laminated film is used in which a 25-nm-thick silicon nitride film is formed first and a 900-nm-thick silicon oxide film is deposited thereon.

Figure 5B:
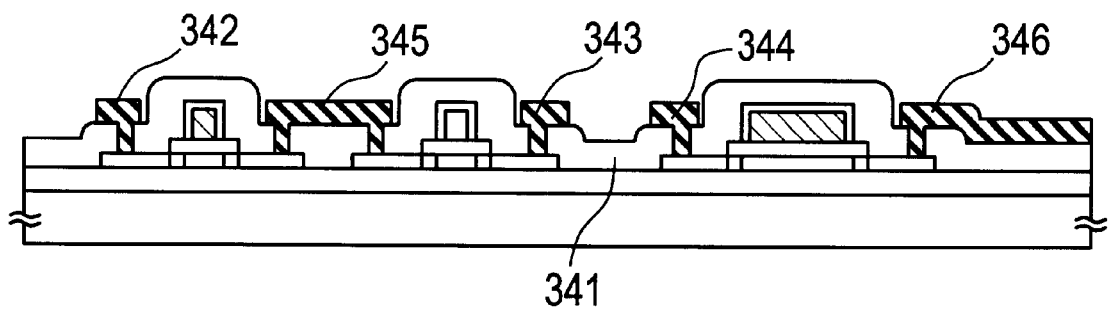

Thereafter, contact holes are formed and then source electrodes 342–344 and drain electrodes 345 and 346 are formed (see FIG. 5B). In this embodiment, since the drain electrode 346 of the pixel TFT is used as a bottom electrode of an auxiliary capacitor, it is shaped so as to be suitable for that purpose.

Then, a silicon nitride film 347 of 10–50 nm in thickness is formed and a 100 -nm-thick capacitor electrode 348 is formed thereon to form the auxiliary capacitor. In this embodiment, a titanium film is used as the capacitor electrode 348 and the auxiliary capacitor is formed by the capacitor electrode 348 and the drain electrode 346.

The silicon nitride film 347 is suitable as a dielectric because it has large relative permittivity. An aluminum film or a chromium film may be used instead of a titanium film.

Since this embodiment is directed to the case of manufacturing a TFT substrate of a reflection-type liquid crystal display device, the space under a pixel electrode can be utilized freely unlike the case of a transmission-type device (i.e., it is not necessary to take the aperture ratio into consideration). This is the reason why the auxiliary capacitor can be formed in the above manner.

Then, an organic resin film as a second interlayer insulating film 349 is formed at a thickness of 0.5–3 μm. Examples of the organic resin are polyimide, acrylic, polyamide, and polyimideamide. Advantages of using the organic resin film are (1) a film can be formed easily, (2) the thickness can be increased easily, (3) the parasitic capacitance can be reduced because of small relative permittivity, and (4) the flatness is high.

Then, a pixel electrode 350 is formed by forming a conductive film on the interlayer insulating film 349 and patterning it. Since this embodiment is directed to the reflection-type device, a material having aluminum as the main component is used as the conductive film for forming the pixel electrode 350 to allow the pixel electrode 350 to function as a reflection film.

Then, the entire device is hydrogenated by heating the entire substrate at 350° C. for 1–2 hours in a hydrogen atmosphere, whereby dangling bonds in the films (particularly in the active layers) are compensated for. As a result of the execution of the above steps, CMOS circuits and a pixel matrix circuit are formed on the same substrate.

FEATURES OF CRYSTALLINE SILICON FILM USED IN THE INVENTION

First, features of a TFT active layer used in the invention will be described. An active layer that has been subjected to the gettering process by a halogen element is a crystalline silicon film having a very characteristic structure.

Specifically, an observation by a TEM (transmission electron microscope) method shows that an active layer is a crystal structural body in which rod-like or flat-rod-like crystals are arranged macroscopically in a particular direction. The crystals are approximately parallel with each other.

The phrase "having regularity in a particular direction" means that the growth directions of a plurality of rod-like or flat-rod-like crystals are approximately the same. Since it is considered that carriers move through the inside of each rod-like or flat-rod-like crystal with priority as if they flew in a trough, it can be said that this crystal structure is anisotropic to carriers.

The inventors have obtained TFTs having very high operation speed by equalizing the growth direction to the channel direction (i.e., the direction in which carriers move when the TFT is in an on-state).

In the gettering process, the number of dangling bonds greatly decreases because at boundaries between crystals (i.e., grain boundaries) Si—Ni bonds are disconnected and recombination occurs to form Si—Si bonds. Therefore, lattice defects do not occur in most of grain boundaries and continuity is held there, and hence substantially no capturing of carriers occurs at grain boundaries. This means increase in carrier mobility, and TFT characteristics that will be described later are considered due to this type of crystal structure.

In connection with the above, the inventors observed lattice fringes of grain boundaries and their vicinities by an HR-TEM (high-resolution transmission electron microscope) method and found that lattice fringes of different crystals had one-to-one correspondence with the crystals and were continuous with each other. That is, it has been found that at grain boundaries crystal lattices have continuity and there are almost no crystal defects such as dangling bonds.

Further, it has been confirmed by a TEM observation that the number of internal defects in a crystal that has been subjected to the gettering process is smaller than in a crystal that has just been crystallized. This is considered due to an effect of the heat treatment at a high temperature (higher than 700° C.).

That is, the annealing step (in this embodiment, the step of FIG. 3D) that is executed at a temperature higher than the crystallization temperature in forming a crystalline silicon film of the invention plays an important role in reducing the number of defects in crystal grains. This will be explained below.

Figure 17A:
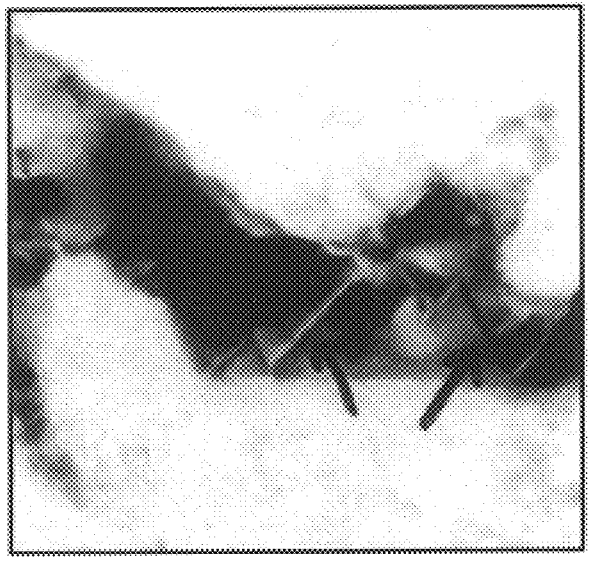
FIGS. 17A and 17B are TEM photographs showing crystal grains of active layers.

FIG. 17A is a TEM photograph, with a magnification of 250,000, of a crystalline silicon film in a state that the crystallization step of FIG. 3B has finished. A zigzagged defect indicated by an arrow is seen in a crystal grain in FIG. 17A (black portions and white portions appear owing to a difference in contrast).

Such defects are mainly stacking faults in which the stacking order of atoms of silicon crystal lattice planes is incorrect, and may be of other types such as a dislocation. The defect in FIG. 17A seems to be a stacking fault whose defect plane is parallel with the {111} plane.

This is inferred from the fact that the zigzagged defect is bent at about 70°.

Figure 17B:
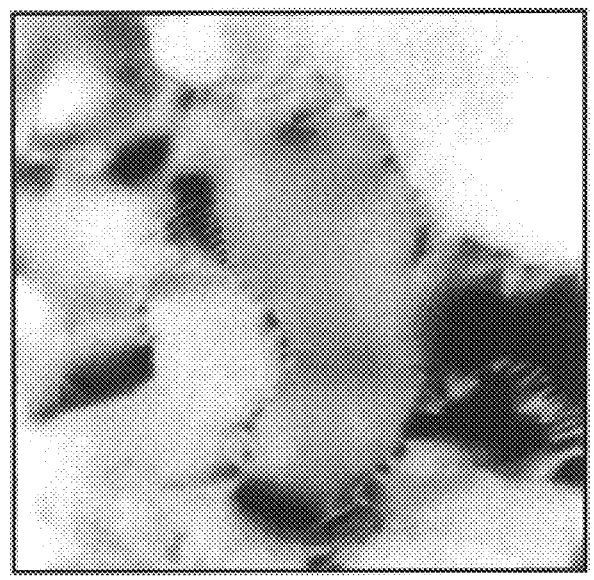

On the other hand, in a crystalline silicon film of the invention shown in FIG. 17B (same magnification), it is seen that there are almost no defects such as stacking faults and dislocations and the crystallinity is very high. This tendency holds over the entire film surface. Although it is difficult under the current technologies to zero is the number of defects, the number of defects can be reduced to such an extent as to be substantially regarded as zero.

That is, the number of defects in each crystal grain is reduced to a negligible level in crystalline silicon films according to the invention, and they can be regarded as a single crystal or can be so regarded substantially because grain boundaries cannot be barriers to carrier movement because of a high level of continuity at the grain boundaries.

As described above, although the crystalline silicon films shown in the photographs of FIGS. 17A and 17B are approximately equivalent in the level of continuity at grain boundaries, they are much different in the number of defects in each crystal grain. The fact that crystalline silicon films of the invention exhibit much superior electrical characteristics to those of the crystalline silicon film of FIG. 17A is largely due to the difference in the number of defects.

The above discussion leads to a conclusion that the step of FIG. 3D is indispensable for the invention. The inventors have conceived the following models for the phenomena occurring in the step of FIG. 3D.

First, it is considered that in the state of FIG. 17A atoms of a material for promoting crystallization of silicon (typically nickel) are segregated at defects (mainly stacking faults) in each crystal grain, that is, many bonds in the form of Si—Ni—Si exist there.

However, Si—Ni bonds are disconnected when Ni atoms are removed from the defects as a result of execution of the material gettering process. Resulting excess dangling bonds of silicon atoms immediately form Si-Si bonds to establish a stable state. The defects disappear in this manner.

Naturally, it is known that defects in a crystalline silicon film disappear when thermal annealing has been performed at a high temperature. However, it is inferred that in the invention the silicon recombination occurs more smoothly because many dangling bonds are generated owing to disconnection of Si—Ni bonds.

It is considered that at the same time, excess silicon atoms that are generated when the crystalline silicon film is thermally oxidized move to defects to establish a stable state and greatly contribute to the formation of Si—Si bonds. This notion is known as the reason why the number of defects is small in each crystal grain of what is called a high-temperature polysilicon film.

The inventors have conceived a model that when a heat treatment has been performed at a temperature (typically 700° C.–1,100° C.) higher than the crystallization temperature, the crystalline silicon film is fixed to the underlying member and the adhesion is increased, as a result of which defects disappear.

The crystalline silicon film and a silicon oxide film as an undercoat film are different from each other in thermal expansion coefficient by a factor close to 10. Therefore, very strong stress is exerted on the crystalline silicon film when the crystalline silicon film is cooled after the conversion from the amorphous silicon film to the crystalline silicon film (FIG. 17A).

Figure 18A:
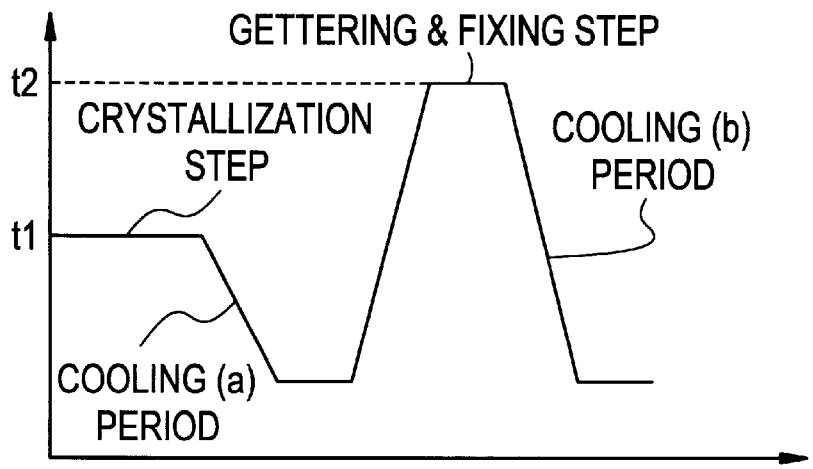
FIGS. 18A–18C illustrate models that explain generation and disappearance of defects.

This will be explained below with reference to FIGS. 18A–18C. FIG. 18A shows a heat history that will be applied to a crystalline silicon film that has just been obtained by the crystallization step. First, the crystalline silicon film that has been crystallized at a temperature $t_j$ is cooled to room temperature in a cooling period (a).

Figure 18B:
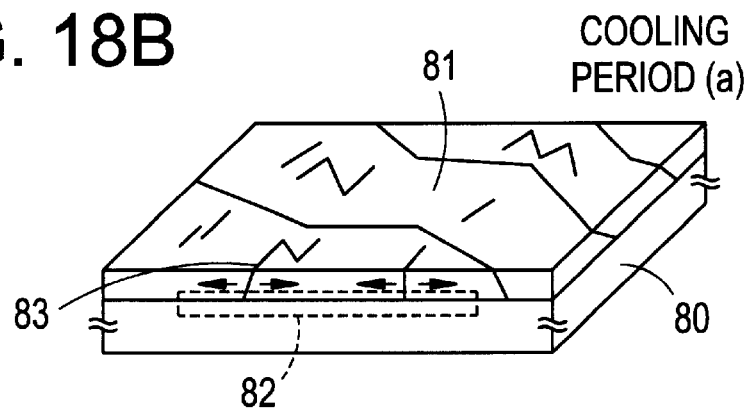
Figure 18C:
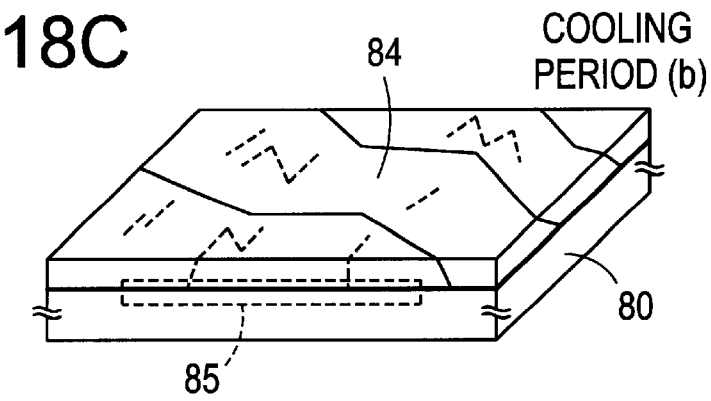

FIG. 18B shows a crystalline silicon film in the cooling period (a). Reference numerals 80 and 81 denote a quartz substrate and a crystalline silicon film, respectively. It is considered that in this state, the adhesion at an interface 82 between the crystalline silicon film 81 and the quartz substrate 80 is not high and a number of defects are generated in each crystal grain owing to such insufficient adhesion.

That is, it is considered that the crystalline silicon film 81 that is being pulled because of the difference in thermal expansion coefficient is very easy to move on the quartz substrate 80 and defects 83 such as stacking faults and dislocations are easily generated by forces such as tensile stress.

The crystalline silicon film shown in FIG. 17A is in this state. Thereafter, the material gettering step is executed at a temperature $t_2$ as shown in FIG. 18A, whereby the defects in the crystalline silicon film disappear for the reasons described above.

It is an important fact that as a result of the execution of the material gettering step the crystalline silicon film is fixed to the quartz substrate to increase the adhesion therebetween. That is, it is considered that the gettering step also serves as a step of fixing the crystalline silicon film to the quartz substrate (underlying member).

After completion of the gettering and fixing step, the crystalline silicon film is cooled to room temperature in a cooling period (b). The cooling period (b) is different from the cooling period (a) that immediately follows the crystallization step in that an interface 85 between the quartz substrate 80 and an annealed crystalline silicon film 84 is in a state of very high adhesion (see FIG. 18C).

Since such high adhesion means that the crystalline silicon film 84 is completely fixed to the quartz substrate 80, defects are not generated even if stress is exerted on the crystalline silicon film 84 while it is cooled. That is, it can be prevented that defects are generated again.

Although FIG. 18A shows the process in which the temperature is decreased to room temperature after execution of the crystallization step, the temperature may immediately be increased after completion of the crystallization step to execute the gettering and fixing step. A crystalline silicon film according to the invention can also be obtained by this type of process.

A crystalline silicon film of the invention (see FIG. 17B) obtained in the above manner has a feature that the number of defects in each crystal grain is much smaller than that of a crystalline silicon film (see FIG. 17A) that has merely been subjected to crystallization.

The difference in the number of defects appears in the form of a difference in spin density in an electron spin resonance (ESR) analysis. At present, it has been found that the spin density of crystalline silicon films according to the invention is at most $5 \times 10^{17}$ spins/cm$^3$ or less (preferably $3 \times 10^{17}$ spins/cm$^3$ or less). It is presumed that actually the spin density is lower than the above measurement value, because the measurement value is close to the detection limits of currently available measuring instruments.

The crystalline silicon film of the invention having the above-described crystal structure and features is called a continuous grain silicon (CGS).

Electrical Characteristics of tht of the Invention

Next, a description will be made of results of studies on the electrical characteristics of thin-film transistors manufactured according to this embodiment. Measurements were conducted by using an instrument on the market (Type No. 4145B of Hewlett-Packard Co.).

First, a first test conducted by the inventors will be described. The inventors measured TFTs by using the above instrument and obtained curves (called a Id-Vg characteristic) that were plotted in such a manner that the horizontal axis represents the gate voltage and the vertical axis represents the drain current. During measurements, a control was so made that the temperature of a sample was kept at room temperature, by means of a thermo-chuck (having a temperature control function) for supporting the sample.

There were two kinds of TFT sizes: L/W=⅝μm (FIG. 1A) and ⁸⁄₂₀₀μm (FIG. 1B), where L is the channel length and W is the channel width.

The degree of deterioration of TFTs were studied in such a manner that first an Id-Vg characteristic in the initial state (i.e., an initial characteristic) was measured and then a deterioration acceleration test was conducted that was 10 times of repetitive measurements under the same conditions.

Figure 1B:
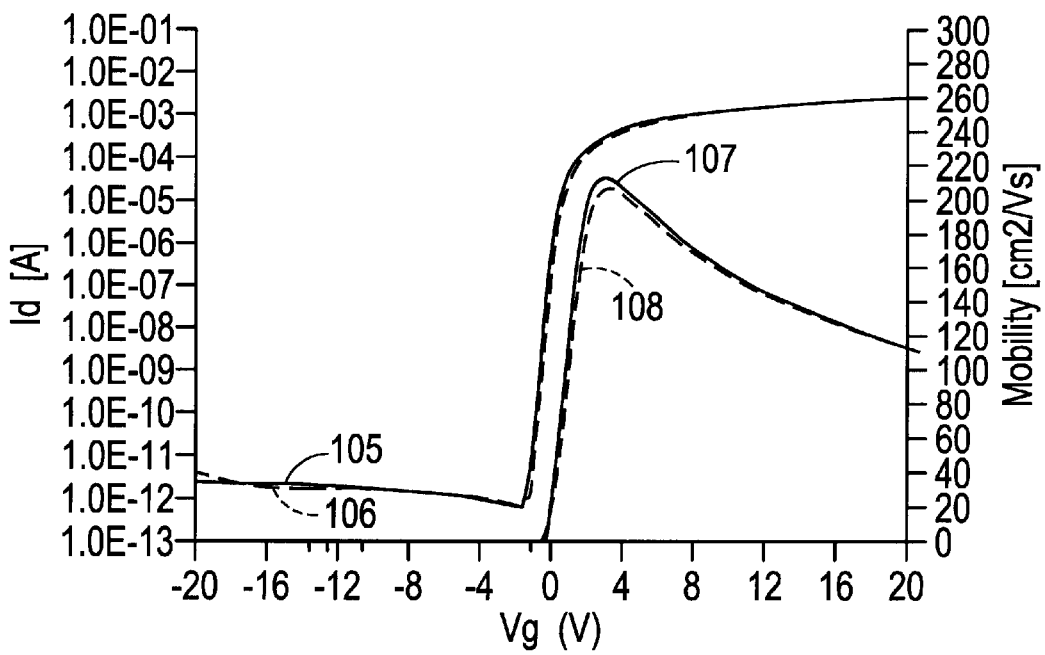

FIGS. 1A and 1B show results of the test. In FIG. 1A, curve 101 (solid line) is an initial ld-Vg characteristic and curve 102 (broken line) is an Id-Vg characteristic measured after 10 times of repetitive measurements.

In FIG. 1A, curve 103 (solid line) and curve 104 (broken line) represent variations of field-effect mobility corresponding to the Id-Vg characteristics 101 and 102, respectively. The mobility is an index of operation speed of a TFT and is obtained by a theoretical calculation from data of an Id-Vg characteristic.

Similarly, in FIG. 1B, curve 105 (solid line) and 106 (broken line) are an initial Id-Vg characteristic and an Id-Vg characteristic measured after the acceleration test, and curve 107 (solid line) and curve 108 (broken line) are initial mobility and mobility after the acceleration test.

Knowledge that the inventors have acquired from the above test results will be described below. In the case of FIG. 1A, while the maximum mobility value close to 300 cm$^2$/Vs is obtained in the initial state, the maximum mobility value is decreased to about 220 cm$^2$/Vs after the acceleration test. The drain current in the gate voltage range below 0 V (called an off-current here) is approximately doubled after the acceleration test.

In contrast, in the case of FIG. 1B, there is no large difference between the initial mobility (curve 107) and the mobility after the acceleration test (curve 108); that is, there is almost no deterioration. No large variation is found in the off-current, either.

The above results show that as for the acceleration test that is 10 times of repetitive measurements a TFT having a larger channel width is more resistant to deterioration. It is noted that the inventors confirmed this tendency in tens of TFTs.

After studying differences in TFT properties due to a difference in channel width based on the above results, the inventors paid attention to self-heating that is caused by large current when the channel width is large. The inventors intentionally heated TFTs having the same structure and conducted acceleration tests (repetitive measurements) in the heated state.

Figure 2A:
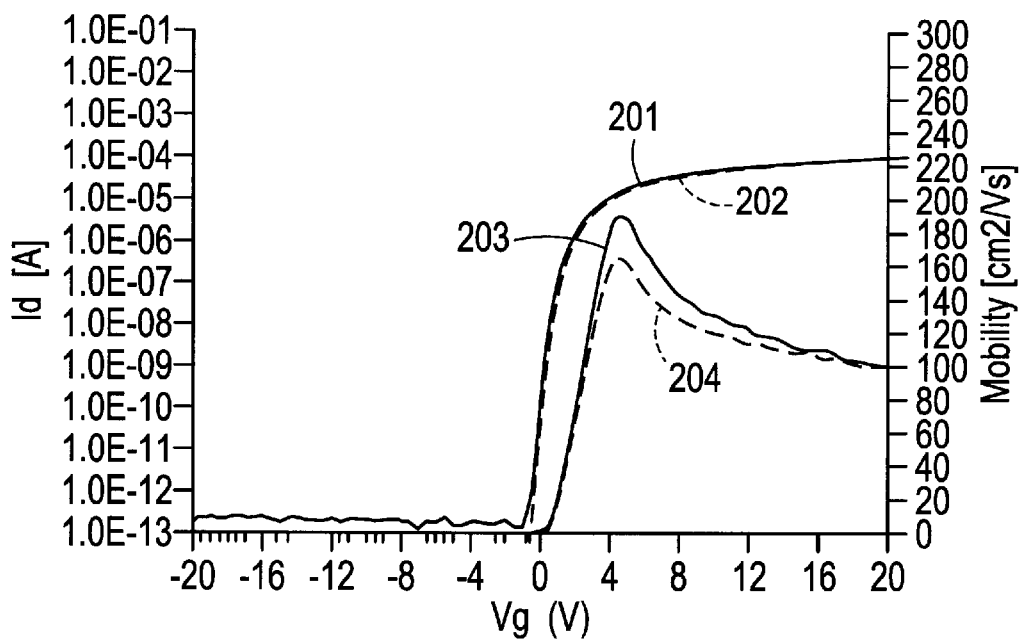
FIGS. 2A and 2B show electrical characteristics of TFTs according to the first embodiment.
Figure 2B:
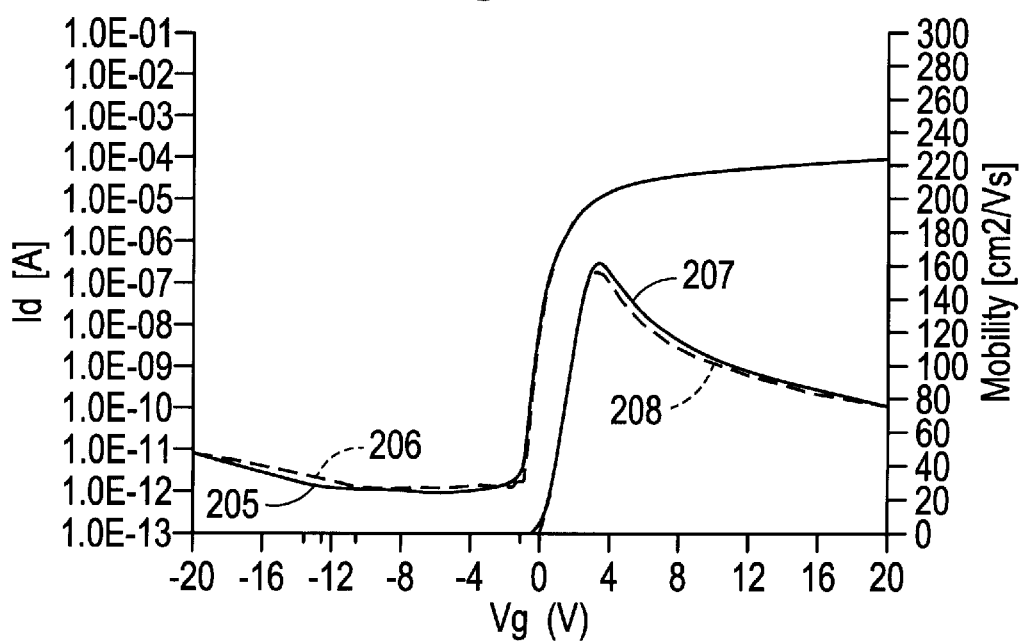

FIGS. 2A and 2B show results of the acceleration tests. FIG. 2A shows results obtained at room temperature with a triple-gate TFT of L/W=$^{6.6}/_2 \mu$m. FIG. 2B shows results obtained with the same triple-gate TFT that was heated to 125° C.

As shown in FIG. 2A, in the case of the acceleration test at room temperature, while no variation is found between an initial Id-Vg characteristic 201 (solid line) and an Id-Vg characteristic 203 (broken line) after the acceleration test, mobility 204 (broken line) after the acceleration test is deteriorated from initial mobility 203 (solid line) by an amount close to 20% in terms of the maximum value.

In contrast, as shown in FIG. 2B, in the case of the acceleration test at 125° C., almost no variation is found between an initial Id-Vg characteristic 205 (solid line) and an Id-Vg characteristic 206 (broken line) after the acceleration test, and no large variation is found between initial mobility 207 (solid line) and mobility 208 (broken line) after the acceleration test.

These results verify that TFTs used in the invention have the property that they become more resistant to deterioration when they are heated. This effect becomes remarkable at 80° C. or more, and occurs up to about 250° C. According to experiments by the inventors, this effect was stable in a temperature range of 100° C.–200° C.

Therefore, as for the test results of FIGS. 1A and 1B, an explanation is made that the TFT having a larger channel width was self-heated and its deterioration was thereby reduced. When a TFT whose channel width is 100 $\mu$m or more is observed with an emission microscope, light emission due to heating is found in the channel and its vicinity when it is in an on-state. This is probably light emission due to heating to 100° C. or more.

In experiments in which the channel length L and the channel width W were set at various values, the above effect of the invention was obtained when the channel width was 100 $\mu$m or more. In particular, the effect was remarkable when a relationship L/W$\leq$0.01 is satisfied (for example, W$\geq$200 $\mu$m if L=2$\mu$m).

The effect that deterioration is prevented or inhibited by heat is a phenomenon that is specific to TFTs used in the invention. When the inventors conducted similar tests on what is called low-temperature polysilicon TFTs, threshold voltages Vth were much shifted by heating and the TFTs were rendered of no use.

The above tests were conducted on TFTs using a low-temperature polysilicon film that was crystallized by using a material for promoting crystallization of silicon such as nickel and a low temperature polysilicon film that was crystallized only by laser annealing without using a material for promoting crystallization of silicon, and results of the two kinds of TFTs were the same.

Inference Relating to TFT of the Invention

The above-described deterioration of a TFT is particularly remarkable in n-type TFTs in which carriers are electrons. As a matter of fact, almost no deterioration was found under any conditions in p-type TFTs manufactured according to this embodiment.

This is readily understood from the fact that typical causes of TFT deterioration are CHE (channel hot electron) injection and (DAHC) drain avalanche hot carrier) injection.

The CHE injection is a phenomenon that electrons in the channel are given high energy by an electric field in the direction along the channel and finally injected into the gate insulating film. The DAHC injection is a phenomenon that electron-hole pairs that are generated by collision between high-energy electrons and lattices and resulting ionization of the high-energy electrons are injected into the gate insulating film (refer to Mistumasa Koyanagi: "Submicron Devices II," Maruzen Co., Ltd., p. 125, 1998).

The above deterioration phenomenon occurs in such a manner that electrons injected in the gate insulating film cause variations in electrical characteristics. It is considered that deterioration due to the CHE injection and the DAHC injection proceeded also in the above-described deterioration acceleration test that is repetitive measurements.

The inventors infer that the reason why the deterioration due to the CHE injection and the DAHC injection can be inhibited by heating a TFT that is used in the invention is that thermal energy causes electrons captured in the gate insulating film to be re-emitted to the active layer.

Being of the full depletion (FD) type, TFTs used in the invention have a feature that the carrier mobility is very large. As a matter of fact, the mobility values shown in FIGS. 1A–1B and 2A–2B exceed 200 cm$^2$/Vs on average. Those TFTs realize electrical characteristics that are never attained by general TFTs.

On the other hand, those TFTs are prone to be deteriorated by the CHE injection and the DAHC injection. TFTs that exhibit very high performance and are highly reliable are realized by preventing or inhibiting such deterioration-by heating those.

Embodiment 2

This embodiment is directed to a manufacturing method for obtaining a gettering effect by the element of phosphorus in addition to the gettering effect by a halogen element that has been described in the first embodiment. This embodiment will be described with reference to FIGS. 6A–6E.

Figure 6A:
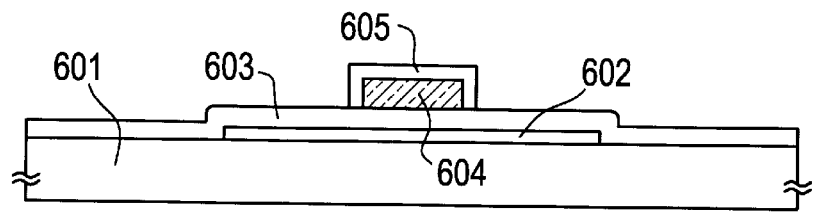
FIGS. 6A–6E show a manufacturing process of a thin-film transistor according to a second embodiment of the invention.
Figure 6B:
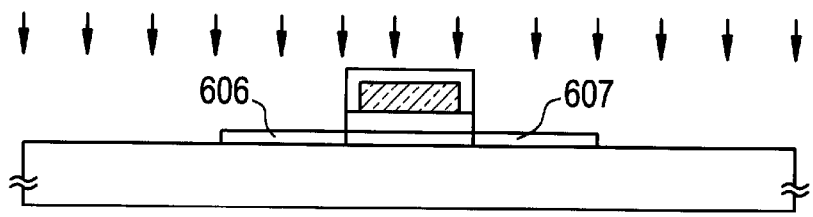

First, the steps to the gettering process by a halogen element are executed in the same manner as in the first embodiment. In FIG. 6A, reference numerals 601–603 denote a quartz substrate, an active layer, and a gate insulating film, respectively.

Then, a gate electrode 604 is formed that is a laminated film of a tantalum film and a film having tantalum as the main component. Then, an anodic oxide film 605 is formed by anodizing the surface of the gate electrode 604 (see FIG. 6A). The anodic oxide film 605 functions as a protective film.

Then, the gate insulating film 602 is etched by dry etching with the gate electrode 604 used as a mask. Thereafter, impurity regions 606 and 607 are formed by adding phosphorus by ion implantation (see FIG. 6B).

Then, sidewalls 608 are formed by forming a thick silicon nitride film and etching it back by dry etching. Subsequently, a source region 609 and a drain region 610 are formed by adding phosphorus again (see FIG. 6C).

In the second phosphorus doping step, phosphorus is not added to the regions under the sidewalls 608 and an a pair of low-concentrat ion impurity regions 611 containing phosphorus at a lower concentration than the source region 609 and the drain region 610 are formed there. The region under the gate electrode 604 becomes a channel forming region 612.

Figure 6C:
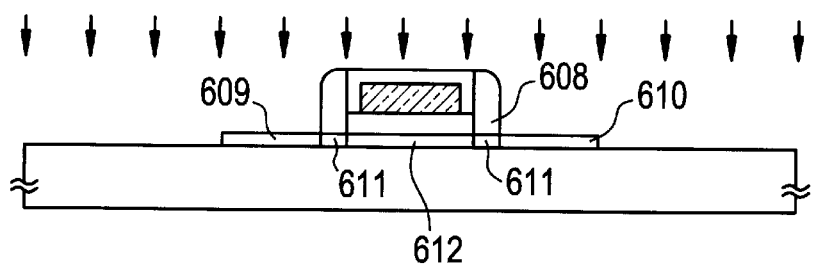

After the state of FIG. 6C has been obtained in the above manner, a heat treatment is performed at 450° C.–650° C. (typically 600° C.) for 8–24 ours (typical Although this heat treatment is intended to cause gettering of the material for promoting crystallization of silicon (in this embodiment, nickel) by the element of phosphorus, at the same time the impurity is activated and damage of the active layer caused by the ion implantation operations is repaired.

In this step, the heat treatment causes nickel remaining in the channel forming region 612 to move to the source region 609 and the drain region 610, where nickel is gettered and inactivated. That is, nickel remaining inside the channel forming region 612 can be removed.

Since the source region 609 and the drain region 610 can function as electrodes as long as they are conductive, whether the nickel is present in or absent from the source region 609 and the drain region 610 does not influence the electrical characteristics. This is the reason why the source region 609 and the drain region 610 can function as gettering sites.

Figure 6D:
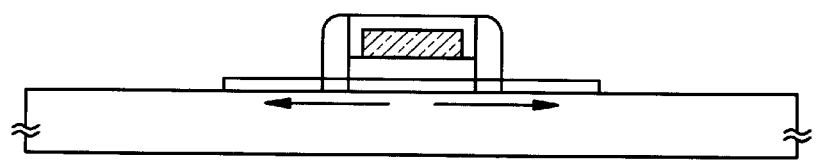
Figure 6E:
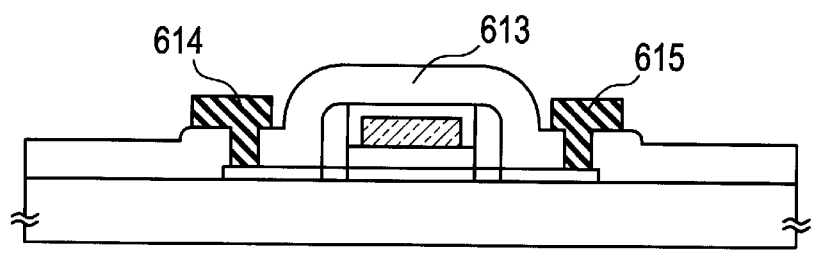

After the state of FIG. 6D has been obtained in the above manner, an interlayer insulating film 613, a source electrode 614, and a drain electrode 615 are formed in the same manner as in the first embodiment, whereby a thin-film transistor is completed as shown in FIG. 6E.

Although in this embodiment tantalum is used as the material of the gate electrode, a conductive crystalline silicon film may be used instead. Further, the method of forming the low-concentration impurity regions is not limited to the method of this embodiment.

The most important feature of this embodiment is that the material remaining in the channel forming region is moved to the source and drain regions and gettered there. This aspect of the invention has been conceived by paying attention to the metal element gettering effect of the element of phosphorus.

This embodiment is directed to the n-type TFT. In the case of the p-type TFT, it is necessary to add both phosphorus and boron to the source and drain regions because addition of only boron cannot provide a gettering effect.

Embodiment 3

Figure 7A:
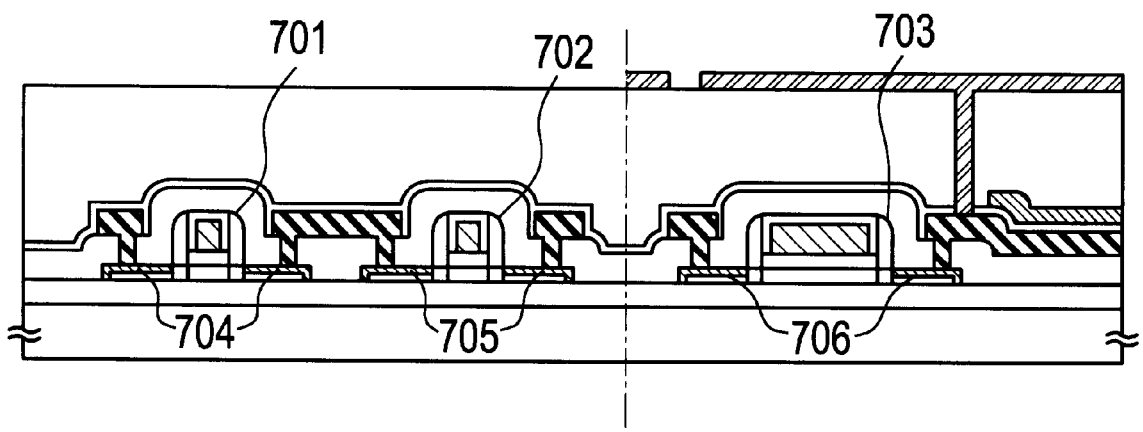
FIGS. 7A and 7B show structures of active matrix substrates according to a third embodiment of the invention.

This embodiment is directed to cases where TFT structures different than in the first embodiment are employed. FIG. 7A shows a structure in which sidewalls are used in forming low-concentration impurity regions.

In this case, non-porous anodic oxide films are formed in the state of FIG. 4A and the gate insulating film is etched with the gate electrodes and the anodic oxide films used as masks. In this state, impurities are added to form $n^-$ regions and $p^+$ regions.

Thereafter, sidewalls 701–703 are formed by etch back and then impurities are added to form $n^+$ regions and $p^+$ regions. As a result of those steps, low-concentration impurity regions ($n^-$ regions and $p^-$ regions) are formed under the sidewalls 701–703.

In the example of FIG. 7A, metal silicide layers 704–706 formed by a known salicide (self-aligned silicide) technique. Example metals for formation of a salicide structure are titanium, tantalum, tungsten, and molybdenum.

Figure 7B:
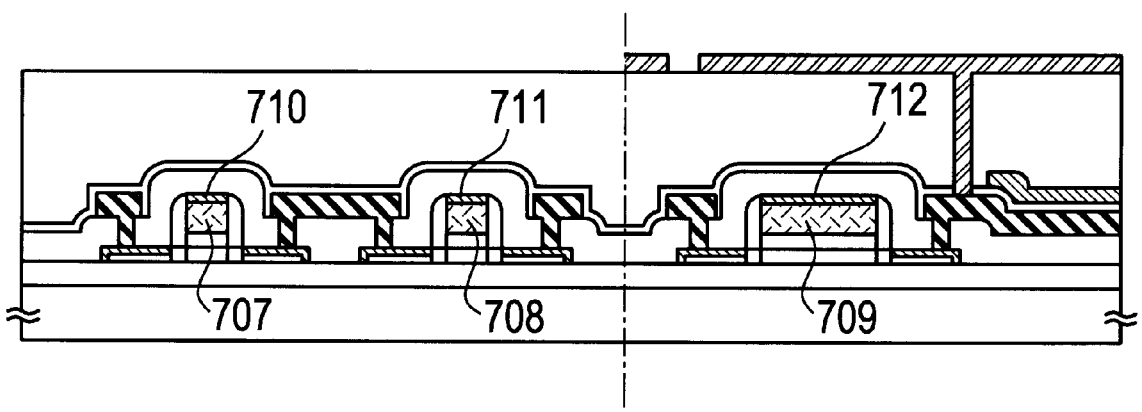

FIG. 7B shows a structure that is characterized in that gate electrodes 707–709 are crystalline silicon films that are given one conductivity type. Usually, the gate electrodes 707–709 are given n-type conductivity. There may be formed dual-gate TFTs in which the gate electrodes of an n-type TFT and a p-type TFT are given different conductivity types.

A salicide structure is also employed in the structure of FIG. 7B. In this case, metal silicide layers 710–712 are also formed on the top surfaces of the respective gate electrodes 707–709.

The structures of this embodiment are so designed as to be suitable for TFTs having high operation speed. In particular, the salicide structure is a technique that is very useful in realizing operation frequency of several gigahertz.

Embodiment 4

This embodiment is directed to cases where an auxiliary capacitor having a different structure than in the first embodiment is formed.

Figure 8A:
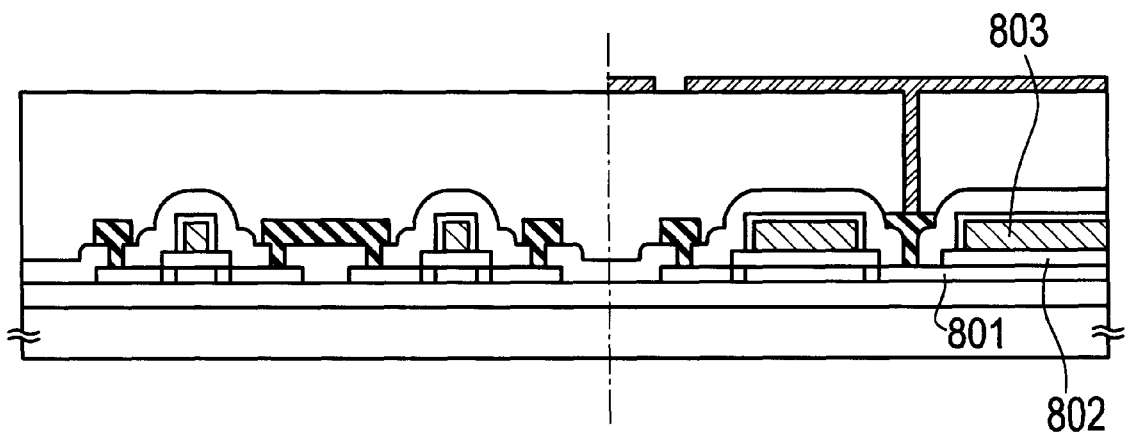
FIGS. 8A and 8B show structures of active matrix substrates according to a fourth embodiment of the invention.

FIG. 8A shows a structure in which a drain region 801 of an active layer is so formed as to be larger than necessary and part of the drain region 801 is used as the bottom electrode of an auxiliary capacitor. In this case, a gate insulating film 802 is laid on the drain region 801 and a capacitor electrode 803 is formed on the gate insulating film 802. The capacitor electrode 803 is made of the same material as the gate electrodes.

The portion of the drain region 801 with which the auxiliary capacitor is to be formed may be rendered conductive either by adding an impurity to it in advance or by utilizing an inversion layer that is formed by applying a constant voltage to the capacitor electrode 803.

Since the structure of FIG. 8A is of a reflection-type liquid crystal display device, the auxiliary capacitor can be formed by utilizing the space on the back side of the pixel electrode to the maximum and hence a very large capacitance can be secured. Although naturally this structure can also be applied to a transmission-type liquid crystal display device, in such a case sufficient care should be taken of the fact that the aperture ratio decreases if the area occupied by the auxiliary capacitor is made unduly large.

Figure 8B:
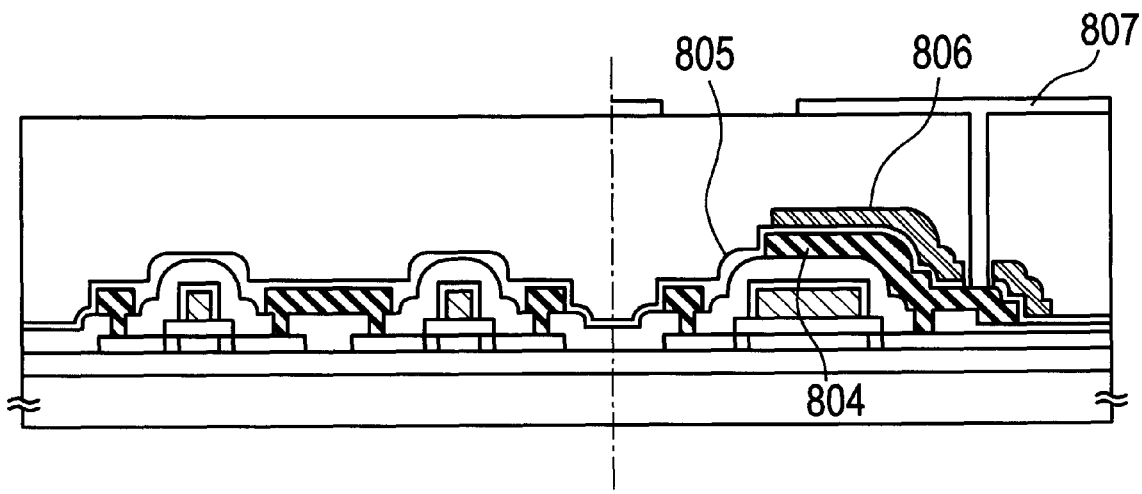

FIG. 8B shows a structure of a transmission-type liquid crystal display device. In this structure, a drain electrode 804 is used as the bottom electrode of an auxiliary capacitor and a silicon nitride film 805 and a black matrix 806 is formed on the drain electrode 804. An auxiliary capacitor is formed by the drain electrode 804 and the black matrix 806.

Thus, the structure of FIG. 8B is characterized in that the black matrix 806 also serves as the top electrode of the auxiliary capacitor.

Because of the transmission-type device, a pixel electrode 807 is a transparent conductive film (e.g., an ITO film).

The structure as shown in FIG. 8B can increase the aperture ratio because the auxiliary capacitor, which tends to occupy a large area, is formed on a TFT. Further, since large-permittivity silicon nitride film that is as thin as about 25 nm can be utilized, a very large capacitance can be secured in a small area.

Embodiment 5

This embodiment is directed to a case where the invention is applied to a thin-film transistor having a different structure than in the first embodiment. This embodiment will be described with reference to FIGS. 9A–9E.

First, a gate electrode 902 is formed on a quartz substrate 901. The gate electrode 902 is formed as a highly heat-resistant electrode that is made of tantalum, silicon, or the like so as to be able to sustain later thermal oxidation steps.

Then, a gate insulating film 903 is formed so as to cover the gate electrode 902 and a 50-nm-thick amorphous silicon film 904 that will become an active layer is formed on the gate insulating film 903. Thereafter, a mask insulating film 905 having an opening is formed and then a nickel-containing layer 906 is formed, in the same manner as in the first embodiment.

Figure 9A:
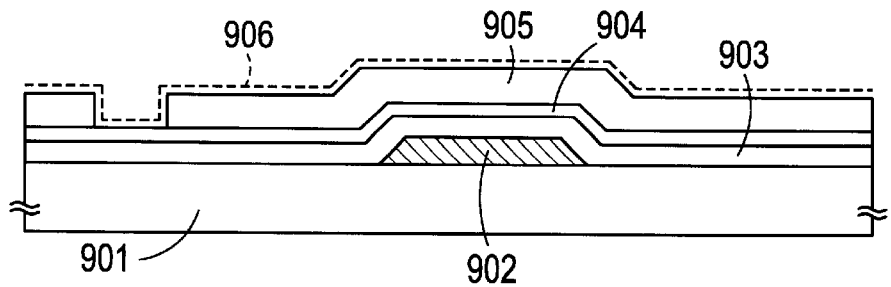
FIGS. 9A–9E show a manufacturing process of a thin-film transistor according to a fifth embodiment of the invention.
Figure 9B:
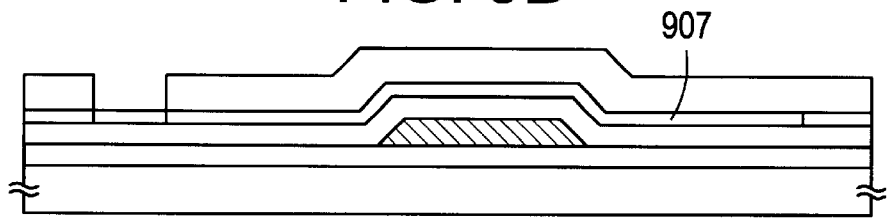
Figure 9C:
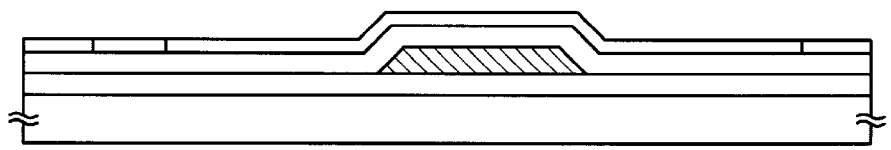

After the state of FIG. 9A has been obtained in the above manner, a heat treatment for crystallization is performed, whereby a crystalline silicon film 907 that is a lateral growth region is obtained (see FIG. 9B).

Thereafter, the mask insulating film 905 is removed and then a heat treatment is performed in an atmosphere containing a halogen element. The conditions of the heat treatment may be the same as in the first embodiment. In this step, nickel is removed from the crystalline silicon film 907 into the vapor phase through gettering (see FIG. 9C).

Figure 9D:
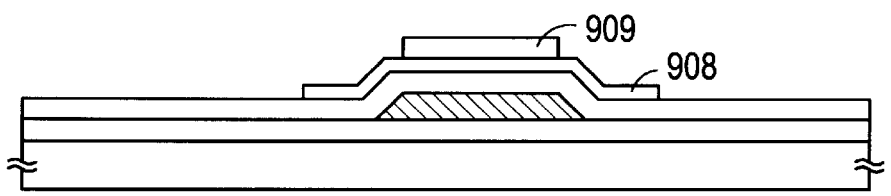

After completion of the gettering process, an active layer 908 that is part of the lateral growth layer its entirety is formed by patterning and a silicon nitride film as a channel stopper 909 is formed thereon (see FIG. 9D).

After the state of FIG. 9D has been obtained, a crystalline silicon film having n-type conductivity is formed and patterned into a source region 910 and a drain region 911. Then, a source electrode 912 and a drain electrode 913 are formed.

Figure 9E:
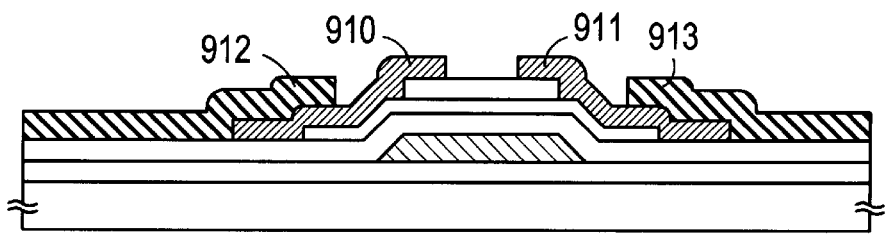

Finally, the entire device is subjected to a heat treatment in a hydrogen atmosphere, whereby an inverted staggered structure TFT is completed as shown in FIG. 9E. Having the active layer that is the same crystalline silicon film as in the first embodiment, the inverted staggered structure TFT of this embodiment also has the feature that the resistance to deterioration is improved when it is heated.

Figure 5C:
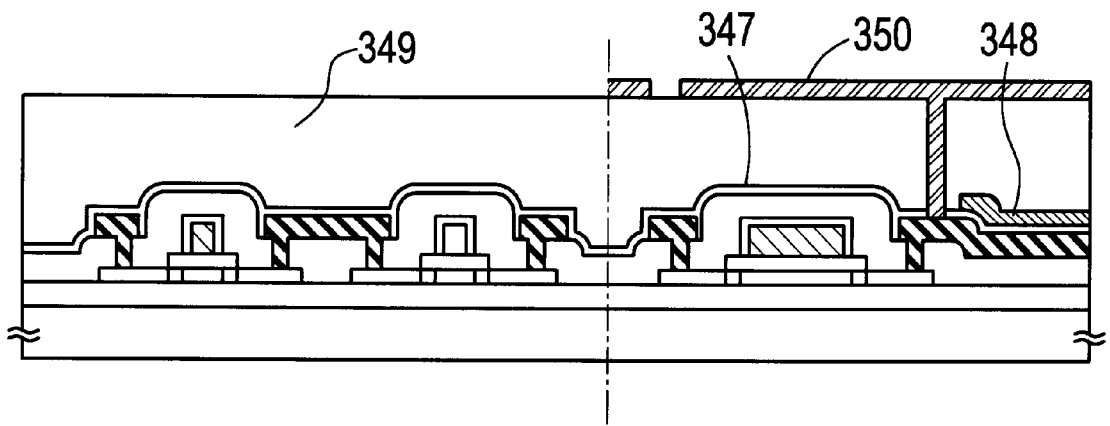

The structure of the inverted staggered structure TFT described in this embodiment can be applied to the structures shown in FIG. 5C (embodiment 1), FIGS. 7A and 7B (embodiment 3), FIGS. 8A and 8B (embodiment 4).

Moreover, the structure of the inverted staggered structure TFT described in this embodiment is just an example and the invention is not limited to such a case. Further, the invention can be applied to not only the inverted staggered structure TFT but also other kinds of bottom-gate TFTs.

Embodiment 6

Figure 10:
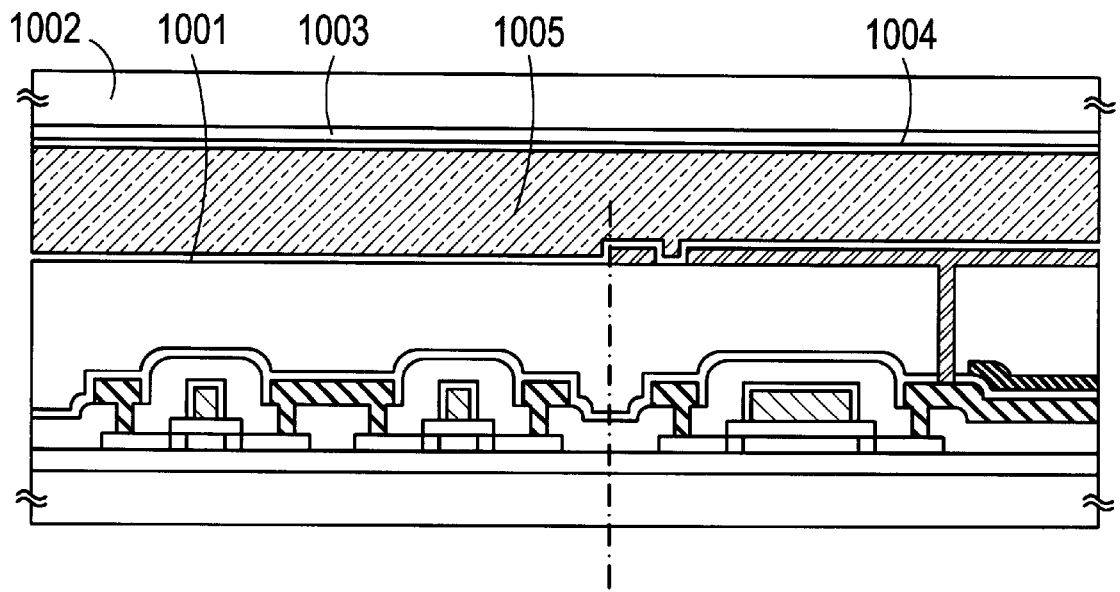
FIG. 10 is a sectional view of a liquid crystal panel according to a sixth embodiment of the invention.

This embodiment is directed to a case where a liquid crystal panel is formed by using TFTs according to any of the first to fifth embodiments. FIG. 10 is a simplified sectional view of an active matrix liquid crystal panel in which a CMOS circuit is formed in an area where driver circuits and logic circuits are formed and a pixel TFT is formed in an area where a pixel matrix circuit is formed.

Since the structures (TFT structures) of a CMOS circuit and a pixel matrix circuit have already been described in the first embodiment, only necessary portions will be described in this embodiment.

First, the state of FIG. 5C is obtained by the manufacturing steps of the first embodiment. A party who practices the invention can make desired modifications such as employing a multi-gate structure in the pixel TFT.

Then, an alignment film 1001 is formed as a preparation on the TFT substrate side. Then, an opposed substrate is prepared that is composed of a glass substrate 1002, a transparent conductive film 1003, and an alignment film 1004. If necessary, a black matrix and color filters (omitted in FIG. 10) are formed on the opposed substrate side.

The active matrix substrate (TFT substrate) and the opposed substrate thus prepared are bonded to each other by a known cell assembling step. A liquid crystal material 1005 is sealed in a space between the two substrates, whereby a liquid crystal panel shown in FIG. 10 is completed.

Various known liquid crystal materials such as twisted-nematic liquid crystal, polymer dispersion liquid crystal, ferroelectric liquid crystal, antiferroelectric liquid crystal, and a mixture of ferroelectric and anti-ferroelectric liquid crystals may be used in the liquid crystal panel of this embodiment.

Moreover, the liquid crystal material needs to be selected in accordance with the operation mode (ECB mode, guest-host mode, or the like) of the liquid crystal. With an assumption that the liquid crystal panel is used in an environment where the liquid crystal panel is likely heated (for example, a case where it is used in a projection TV), it is preferable to use a liquid crystal material that is high in heat resistance.

As described later, where the invention is applied to a rear projection TV, an advantage is obtained that the use of TFTs as described in the first embodiment makes it unnecessary to use an air-cooling fan (i.e., the reliability is high in a temperature range of about 80° C.–250° C.).

Therefore, to effectively utilize the invention, it is necessary to use a liquid crystal material whose clearing point (the temperature at which a liquid crystal material starts to be isotropic) is at least 100° C. or more (preferably 150° C. or more).

Figure 11:
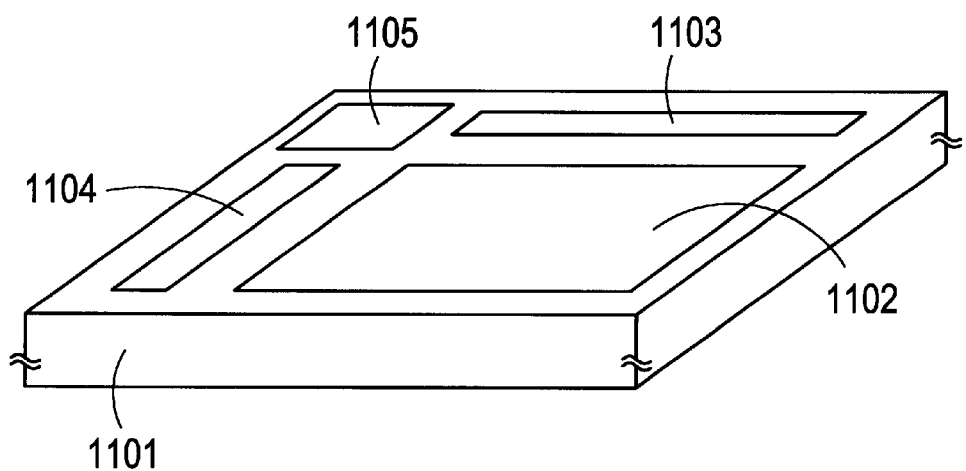
FIG. 11 is a perspective view of an active matrix substrate.

FIG. 11 shows a simplified appearance of an active matrix substrate as shown in FIG. 5C. In FIG. 11, reference numeral 1101 denotes a quartz substrate; 1102, a pixel matrix circuit; 1103, a source driver circuit; 1104, a gate driver circuit; and 1105, a logic circuit.

In a broad sense, the logic circuit 1105 includes all logic circuits that are constituted of TFTs. However, for distinction from circuits that are conventionally called a pixel matrix circuit and a driver circuit, in this embodiment this term means signal processing circuits (a D/A converter etc.) other than those circuits.

The liquid crystal panel thus formed is provided with FPC (flexible print circuit) terminals as external terminals. In general, a liquid crystal module is a liquid crystal panel to which an FPC is attached.

Embodiment 7

Figure 12A:
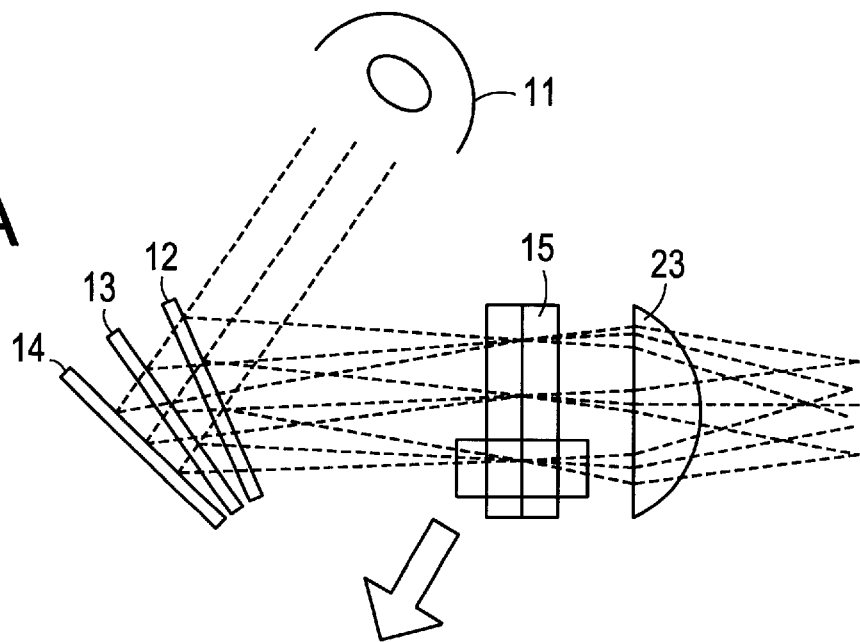
FIGS. 12A and 12B show the configuration of a single-panel optical engine according to a seventh embodiment of the invention.
Figure 12B:
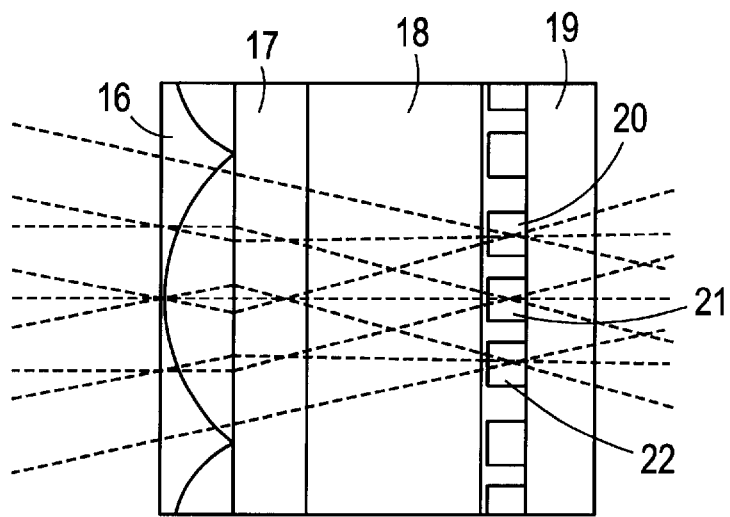

This embodiment is directed to an example of an optical system (optical engine) for projecting an image that is displayed on a liquid crystal module onto a screen in a projection TV. FIGS. 12A and 12B show an example of a single-panel optical engine in which a microlens array is provided on the opposed substrate side.

Strong light emitted from a lamp light source 11 such as a halogen lamp or a metal halide lamp enters dichroic mirrors 12–14. In this embodiment, an R (red) component beam is reflected by the dichroic mirror 12, a B (blue) component beam is reflected by the dichroic mirror 13, and a G (green) component beam is reflected by s the dichroic mirror 14 (or a full-reflection mirror).

The dichroic mirrors 12–14 are arranged so as to form slight angles with each other rather than parallel with each other, whereby the R, B, and G component beams enter a liquid crystal panel 15 at different incident angles. (FIG. 12A)

The liquid crystal panel 15 is composed of a microlens array 16, an opposed substrate 17, a liquid crystal layer 18, and an active matrix substrate 19. Reference numerals 20–22 denote pixels corresponding to R, B, and G, respectively. (FIG. 12B)

The beams that have entered the liquid crystal panel 15 at the incident angles that are slightly different from each other are focused at three different positions after passage through the microlens array 16. Therefore, for example, it is possible to input only the R component beam selectively to the corresponding pixel 20 by disposing the pixel 20 at the position where the R component beam is focused.

With such arrangement design, the R, G, and B component beams are incident selectively on the respective pixels 20–22. This special arrangement enables a single-panel optical engine without the need for using color filters.

Light beams carrying information of the respective pixels are formed as a result of passage through the liquid crystal panel 15. The resulting light beams are converged by a Fresnel lens 23 and guided to a projection lens (not shown). R, G, and B images are finally combined on the screen.

With the configuration of this embodiment, because it is not necessary to use color filters, the screen can be made several times brighter than in conventional product types having the equivalent resolution.

Embodiment 8

This embodiment is directed to a case where a three-panel optical engine is constructed by using a transmission-type liquid crystal module. This embodiment will be described with reference to FIG. 13.

Figure 13:
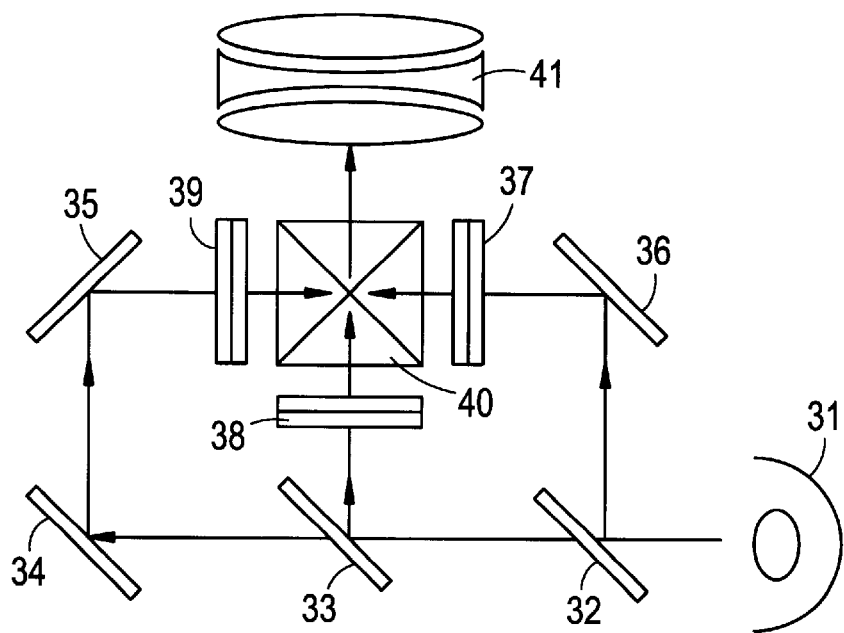
FIG. 13 shows the configuration of a transmission-type three-panel optical engine according to an eighth embodiment of the invention.

In FIG. 13, reference numeral 31 denotes a lamp light source; 32 and 33, R and G dichroic mirrors, respectively; 34–36, full-reflection mirrors; 37–39, R, G, and B transmission-type liquid crystal panels, respectively; 40, a dichroic prism; and 41, a projection lens.

Strong light is emitted from the lamp light source 31 and only the R component beam is reflected by the dichroic mirror 32. The R component beam is changed in traveling direction by the full-reflectio n mirror 36 and enters the R liquid crystal panel 37.

Only the G component beam is reflected by the G dichroic mirror 33 and enters the G liquid crystal panel 38.

The B component beam that has passed through the dichroic mirrors 32 and 33 is reflected by the full-reflection mirrors 34 and 35 and enters the B liquid crystal panel 39.

Light beams carrying video information that have passed through the R, G, and B liquid crystal panels 37–39, respectively, in the above manner are recombined by the dichroic prism 40 and projected onto a screen by a projection lens.

In the optical engine shown in FIG. 13, optical system lenses such as a condenser lens are omitted. Actually, optical adjustments are made by a fly-eye lens, a condenser lens, etc.

Although this type of optical system using a dichroic prism requires high-level techniques to secure the accuracy of the prism, it is very useful in utilizing light effectively. Further, a projection lens can be made smaller because of, for example, advantages that color composition is made easier and the back focal length of the projection lens can be shortened.

Therefore, it can be said that the configuration of this embodiment is advantageous in terms of reduction in the size and weight of the optical engine and the reduction in size leads to a marked advantage in cost.

Naturally it is possible to construct an optical engine without using a dichroic prism. Modifications of this kind are just design items that a party who practice the invention can change properly when necessary.

Embodiment 9

This embodiment is directed to a case where a reflection-type three-panel optical engine is used. This embodiment will be described with reference to FIG. 14, where optical system lenses such as a fly-eye lens and a condenser lens are omitted as in the case of the eighth embodiment.

Figure 14:
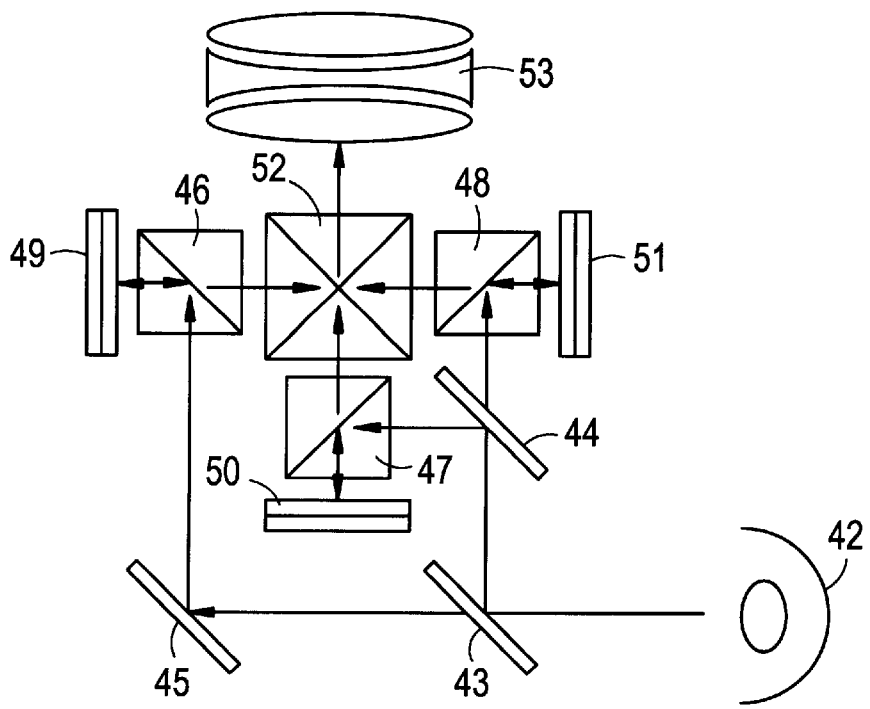
FIG. 14 shows the configuration of a reflection-type three-panel optical engine according to a ninth embodiment of the invention.

In FIG. 14, reference numeral 42 denotes a lamp light source; 43 and 44, dichroic mirrors; 45, a full-reflection mirror; 46–48, polarizing beam splitters (PBSs); 49–51, R, G, and B liquid crystal panels; 52. a dichroic prism; 53, a projection lens.

Strong light is emitted from the lamp light source 42 and only the R component beam is transmitted by the dichroic mirror 43 and G and B component beams are reflected by the same. Only the G component beam is reflected by the dichroic mirror 44.

The R component beam that has passed through the dichroic mirror 43 is reflected by the full-reflection mirror 45 and input to the polarizing beam splitter 46. The G and B component beams are input to the polarizing beam splitters 47 and 48, respectively.

The polarizing beam splitters 46–48 have a function of separating input light into P-polarization light and S-polarization light as well as a property of transmitting only the P-polarization light. Therefore, the R, G, and B liquid crystal panels 49–51 receive R, G, and B S-polarization beams, respectively.

In each of the liquid crystal panels 49–51, liquid crystal molecules are so aligned as to reflect incident light without causing any change in polarization direction when a pixel is in an off-state. When a pixel is in an on-state, the orientation of liquid crystal molecules is changed and the polarization direction of output light is changed accordingly.

Therefore, only portions of the S-polarization beams incident on portions of the liquid crystal panels 49–51 where pixels are in an onstate are converted to P-polarization beams through reflection. That is, only light beams that have been reflected by on-state pixels can pass through the polarization beam splitters 46–48.

Light beams carrying video information that have passed through the polarizing beam splitters 46–48 in this manner are combined by the dichroic prism 52 and input to the projection tens 53. Combined light is projected onto a screen by the projection lens 53.

Because of the use of the dichroic prism, the reflection-type optical engine of this embodiment can also be reduced in size and weight. Also in this embodiment, a modification that does not use a dichroic prism is just a change in a non-essential design item.

Embodiment 10

Figure 15A:
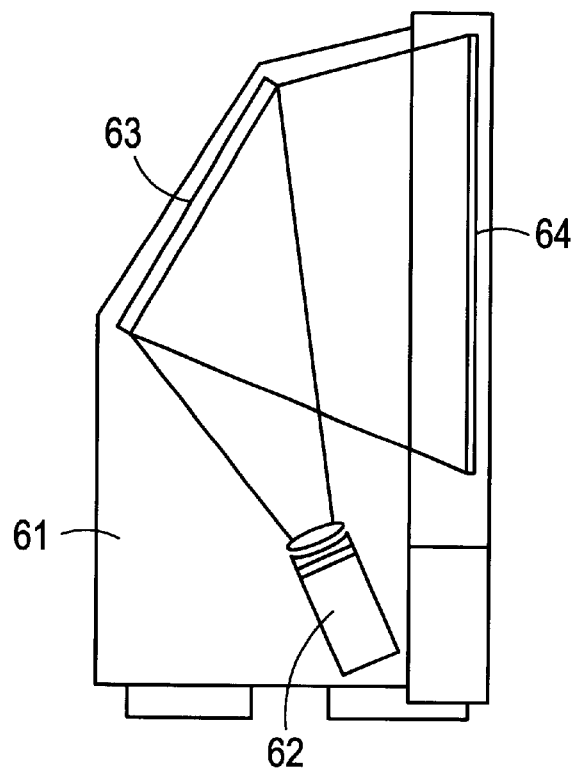
FIGS. 15A and 15B show the configuration of a rear projection TV according to a 10th embodiment of the invention.
Figure 15B:
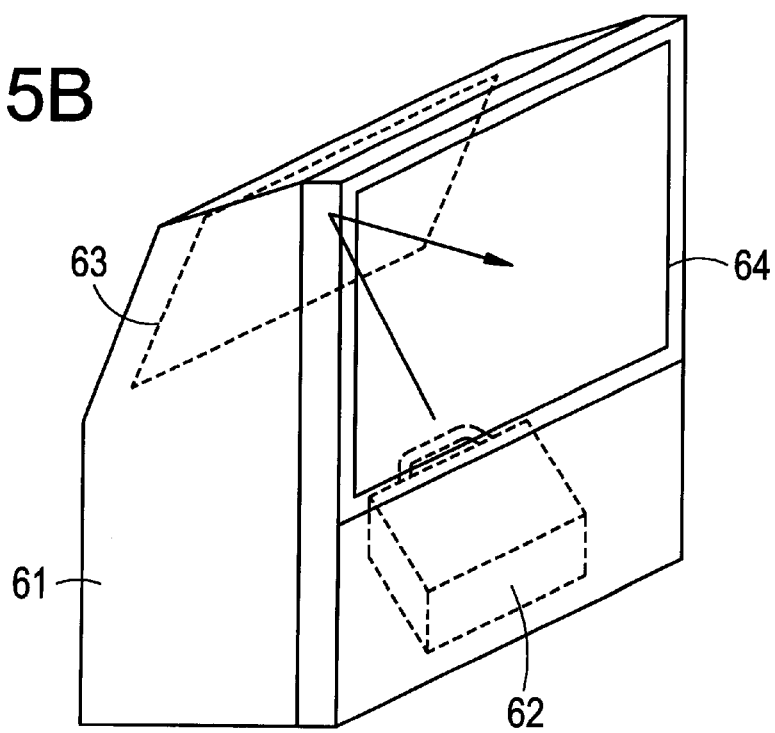

This embodiment is directed to a projection TV set that incorporates an optical engine according to any of the seventh to ninth embodiments. This projection TV is one that is commonly called a rear projection TV. FIG. 15A is a side view showing an internal structure in a simplified manner. FIG. 15B is a perspective view from above.

In FIGS. 15A and 15B, reference numeral 61 denotes a main body; 62, an optical engine; 63, a reflector; and 64, a screen. Although actually a complex system is configured with addition of other optical systems, only the general configuration will be described in this embodiment.

The optical engine 62 may have any of the configurations shown in FIGS. 12–14. The liquid crystal module incorporated in the optical engine 62 includes the liquid crystal panel(s) having the structure as described in the sixth embodiment.

This liquid crystal module can be configured so as to deal with any of NTSC, PAL and digital video signals by using a proper semiconductor circuit that is constituted of TFTs (described in the first embodiment) and integrated with other circuits on the same substrate.

Further, even if a video signal is one that accommodates different S resolutions such as in XGA, SXGA, and UXGA, reduction in resolution can be avoided by taking a proper measure such as black-displaying unnecessary portions by means of a logic circuit or the like.

The most important advantage of the projection TV of the invention is that an air-cooling fan for cooling the liquid crystal panel(s) is not necessary.

Usually, in an optical engine, very strong light is applied to the liquid crystal panel and hence the liquid crystal panel is heated to a very high temperature. In general projection TVs, the liquid crystal panel is cooled with an air-cooling fan or the like during operation because excessive application of heat deteriorates the TFT characteristics and impairs the reliability to a large extent.

However, since the air-cooling fan sucks external air, it has a problem of sucking also minute dust etc. in the air. That is, there is a problem that dust that has been sucked by the air-cooling fan may stick to the back side of the screen to deteriorate the image quality.

In particular, this problem is very serious in rear projection TVs that are commonly used in homes. That is, usual home users are obliged to request a manufacturer or an electric appliance store to perform maintenance work because they cannot do it by themselves.

In contrast, the projection TV of this embodiment enables a configuration that does not require an air-cooling fan, because it uses TFTs whose reliability increases when they are heated as described in the first embodiment. Since it is not necessary to take external air into the inside of the main body, the problem that dust sticks to the back side of the screen can be avoided.

Even with the configuration that does not use an air-cooling fan, almost no deterioration due to temperature increase occurs in the TFTs and hence the liquid crystal module is kept very high in reliability. Therefore, this embodiment realizes a projection TV that is kept highly reliable even if the TFT operation temperature (i.e., the environment temperature of the TFTs during operation) is increased to 80° C.–250° C. (preferably 100° C.–200° C.).

It goes without saying that also in this case the clearing point of the liquid crystal material used in the liquid crystal panel is 100° C. or more (preferably 150° C. or more).

Embodiment 11

This embodiment is directed to a projection TV having a different configuration than in the 10th embodiment. This projection TV is one that is commonly called a front projection TV.

Figure 16A:
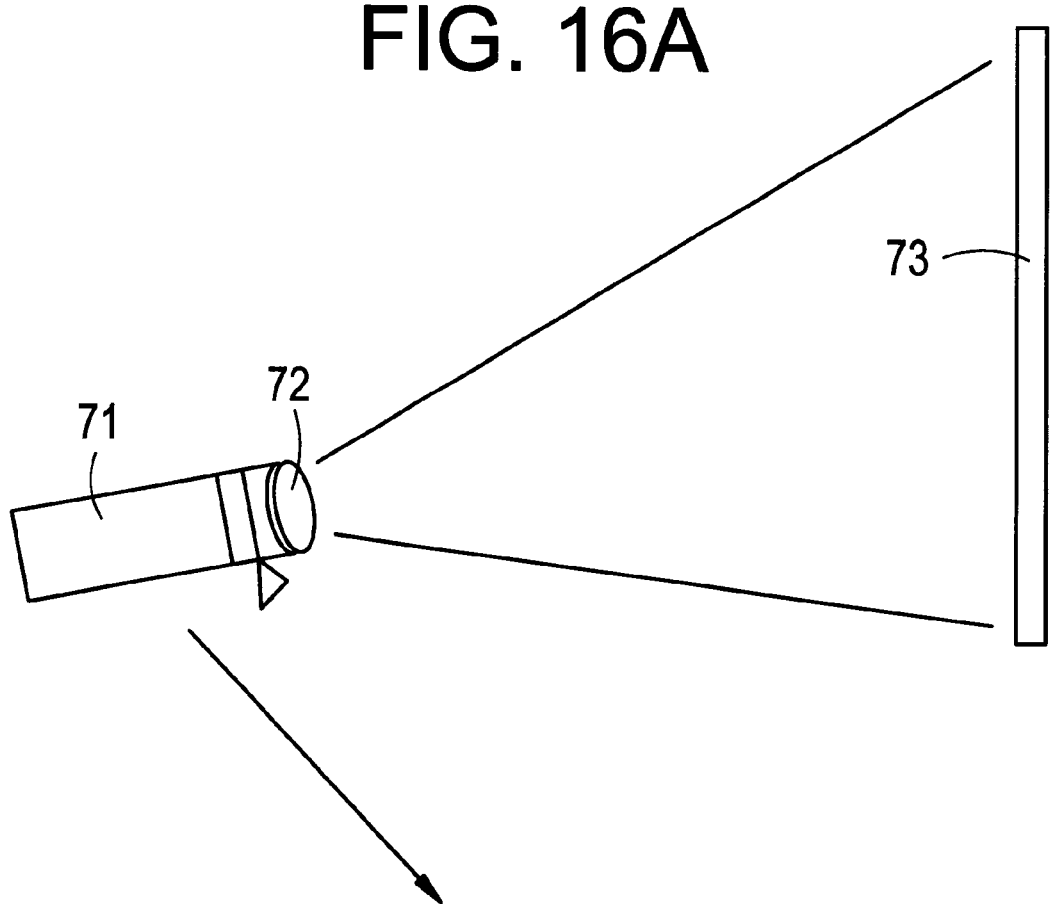
FIGS. 16A and 16B show the configuration of a front projection TV according to an 11th embodiment of the invention.
Figure 16B:
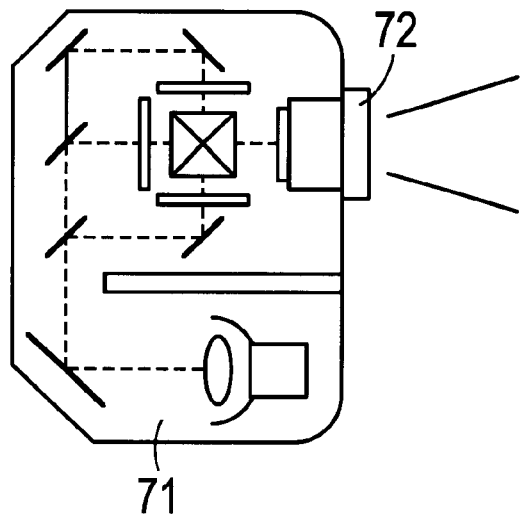

FIGS. 16A and 16B show a simplified configuration of a front projection TV. In FIGS. 16A and 16B, reference numerals 71–73 denote a projection apparatus main body, a projection lens, and a screen, respectively.

An optical engine as described in any of the seventh to ninth embodiments is provided inside the apparatus main body 71. Light carrying video information is projected onto the screen 73 by the projection lens 72.

In this embodiment, a three-panel transmission-type optical engine (eighth embodiment) is used as an example of the internal structure of the apparatus main body 71.

The most important feature of front projection TVs is that an image is displayed on a large-size screen, and hence front projection TVs have a great demand for conference or presentation purposes. Typical screen sizes are 100 inches and 200 inches.

However, general front projection TVs necessarily require a measure against thermal deterioration because heat is easily accumulated inside the apparatus main body. This is a factor of obstructing reduction in the size and weight as well as the cost of the apparatus.

In contrast, the front projection TV of this embodiment is highly resistant to heat and can be highly reliable even when it is heated. Therefore, it can be said that the front projection TV of this embodiment can readily attain miniaturization etc. of the apparatus.

Further, as in the case of the rear projection TV of the 10th embodiment, the front projection TV of this embodiment can be configured so as to deal with various video signals such as an NTSC signal, a PAL signal, and a digital signal or various resolution ranges from VGA to UXGA.

As described above, according to the invention, a projection TV is provided with a liquid crystal module using TFTs as described in the first embodiment having a property that the reliability is increased by heating. By providing this configuration, the invention realizes a projection TV that is highly resistant to heat and hence is highly reliable.

The invention also enables manufacture of a rear projection TV that does not use an air-cooling fan because of its high resistance to heat. This type of rear projection TV is free of the problem that dust sticks to the back side of the screen, and has an advantage of being maintenance free. This is particularly advantageous for use in general homes.

What is claimed is:

1. A projection TV having at least an optical system and at least one liquid crystal module, said liquid crystal module having a plurality of thin-film transistors formed over a substrate having an insulating surface,
   wherein each of said thin-film transistors has a channel forming region that is a crystal structural body in which a plurality of rod-like or flat-rod-like crystals are arranged approximately parallel with each other in a particular direction, and
   wherein said thin-film transistors have an operation temperature of 80° C.–250° C.

2. The projection TV according to claim 1, wherein a video signal to be processed in the liquid crystal module is a digital signal.

3. The projection TV according to claim 1, wherein a liquid crystal material that is sealed in the liquid crystal module has a clearing point that is 100° C. or more.

4. The projection TV according to claim 1, wherein the channel forming region contains one or a plurality of elements selected from the group consisting of Ni, Ge, Co, Fe, Pd, Pt, Cu, and Au at a concentration of $5\times10^{17}$ atoms/cm$^3$ or less.

5. The projection TV according to claim 1, wherein the channel forming region is fully depleted in an on-state.

6. The projection TV according to claim 1, wherein the channel forming region is heated by self-heating in an on-state.

7. The projection TV according to claim 6, wherein the channel forming region has a channel width that is 100 $\mu$m or more.

8. The projection TV according to claim 6, wherein a channel length L and a channel width W of the channel forming region satisfy a relationship $L/W \leq 0.01$.

9. The projection TV according to claim 1, wherein an image displayed on the liquid crystal module is projected, from inside, onto a screen that is provided inside a main body.

10. A projection TV having at least an optical system and at least one liquid crystal module, said liquid crystal module having a plurality of thin-film transistors formed over a substrate having an insulating surface, wherein each of said thin-film transistors has a channel forming region that is a crystal structural body in which a plurality of rod-like or flat-rod-like crystals are arranged approximately parallel with each other in a particular direction and crystal lattices are continuous at most of grain boundaries, and wherein said thin-film transistors have an operation temperature of 80° C.–250° C.

11. The projection TV according to claim 10, wherein a video signal to be processed in the liquid crystal module is a digital signal.

12. The projection TV according to claim 10, wherein a liquid crystal material that is sealed in the liquid crystal module has a clearing point that is 100° C. or more.

13. The projection TV according to claim 10, wherein the channel forming region contains one or a plurality of elements selected from the group consisting of Ni, Ge, Co, Fe, Pd, Pt, Cu, and Au at a concentration of $5 \times 10^{17}$ atoms/cm$^3$ or less.

14. The projection TV according to claim 10, wherein the channel forming region is fully depleted in an on-state.

15. The projection TV according to claim 10, wherein the channel forming region is heated by self-heating in an on-state.

16. The projection TV according to claim 15, wherein the channel forming region has a channel width that is 100 μm or more.

17. The projection TV according to claim 15, wherein a channel length L and a channel width W of the channel forming region satisfy a relationship $L/W \leq 0.01$.

18. The projection TV according to claim 10, wherein an image displayed on the liquid crystal module is projected, from inside, onto a screen that is provided inside a main body.

19. A projection-type display device having at least an optical system and at least one liquid crystal module having a pixel matrix circuit, at least one driver circuit, and a logic circuit over a substrate, said pixel matrix circuit comprising:

at least one active layer comprising crystalline semiconductor film over an insulating surface of said substrate, said active layer having at least channel, source, and drain regions of a thin-film transistor;

a gate electrode adjacent to said active layer with an gate insulating film therebetween; and an auxiliary capacitor composed of a part of said drain region, a capacitor electrode, a layer disposed between said part of the drain region and said capacitor electrode, wherein said capacitor electrode comprises the same material as the gate electrode and said layer comprises the same material as the gate insulating film.

20. The device according to claim 19, wherein said liquid crystal module is a reflection-type display device.

21. The device according to claim 19, wherein said liquid crystal module further comprising a pixel electrode over said auxiliary capacitor.

22. The device according to claim 19, wherein said projection-type type display is a projection TV.

23. A projection-type display device having at least an optical system and at least one liquid crystal module having a pixel matrix circuit, at least one driver circuit, and a logic circuit over a substrate, said pixel matrix circuit comprising:

at least one active layer of a thin-film transistor comprising crystalline semiconductor film over an insulating surface of said substrate, said active layer having at least channel, source, and drain regions of said thin-film transistor;

a gate electrode adjacent to said active layer with an gate insulating film therebetween;

a drain electrode connected with said drain region disposed over the thin-film transistor; and a black mask disposed between said thin-film transistor and a, pixel electrode after;

wherein an auxiliary capacitor of the pixel matrix circuit is composed of said drain electrode, said black mask, and a layer disposed between said drain electrode and said black mask.

24. The device according to claim 23, wherein said liquid crystal module is a transmission-type display device.

25. The device according to claim 23, wherein said pixel electrode is a transparent conductive film.

26. The device according to claim 23, wherein said layer comprises silicon nitride.

27. The device according to claim 23, wherein said projection-type display device is a projection TV.

* * * * *

UNITED STATES PATENT AND TRADEMARK OFFICE
CERTIFICATE OF CORRECTION

PATENT NO. : 6,617,648 B1
DATED : September 9, 2003
INVENTOR(S) : Yamazaki et al.

It is certified that error appears in the above-identified patent and that said Letters Patent is hereby corrected as shown below:

Title page,
Item [56], References Cited, U.S. PATENT DOCUMENTS, replace "6,325,515" with -- 6,323,515 --

Signed and Sealed this

Twentieth Day of January, 2004

JON W. DUDAS
*Acting Director of the United States Patent and Trademark Office*